(12) United States Patent  (10) Patent No.: US 12,525,986 B2
Biswas et al.                (45) Date of Patent:     Jan. 13, 2026

(54) DIGITAL TO ANALOG CONVERSION

(71) Applicant: Texas Instruments Incorporated, Dallas, TX (US)

(72) Inventors: Avishek Biswas, Dallas, TX (US); Hetul Sanghvi, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 69 days.

(21) Appl. No.: 18/343,289

(22) Filed: Jun. 28, 2023

(65) Prior Publication Data
US 2024/0364354 A1    Oct. 31, 2024

Related U.S. Application Data

(60) Provisional application No. 63/498,217, filed on Apr. 25, 2023.

(51) Int. Cl.
H03M 1/10 (2006.01)

(52) U.S. Cl.
CPC .................. H03M 1/1014 (2013.01)

(58) Field of Classification Search
CPC .......... H03M 1/10; H03M 1/42; H03M 1/742; H03M 1/662; H03M 1/1014
See application file for complete search history.

(56) References Cited

U.S. PATENT DOCUMENTS

| | | | | |
|---|---|---|---|---|
| 5,642,116 A | * | 6/1997 | Gersbach | H03M 1/1052 341/145 |
| 6,614,006 B2 | * | 9/2003 | Pastore | H05B 3/746 219/447.1 |
| 7,336,212 B2 | * | 2/2008 | Fung | H03M 1/1225 714/740 |
| 7,446,693 B1 | * | 11/2008 | Perraud | H03M 1/64 341/161 |
| 8,779,550 B2 | | 7/2014 | Liu | |
| 8,797,204 B2 | * | 8/2014 | Yoon | H03M 1/466 341/172 |
| 8,884,797 B2 | * | 11/2014 | Peng | G09G 3/3688 341/172 |
| 9,071,271 B1 | * | 6/2015 | Low | H03M 1/66 |
| 9,252,797 B1 | * | 2/2016 | Kabir | H03M 1/665 |
| 9,379,728 B1 | * | 6/2016 | Singh | H03M 1/1047 |
| 9,954,547 B1 | * | 4/2018 | Azenkot | H03K 5/135 |

(Continued)

OTHER PUBLICATIONS

Crowe et al., "Combinational logic circuits", 1998, Chapter 4, p. 89, Butterworth-Heinemann, 1998.

(Continued)

*Primary Examiner* — Lam T Mai
(74) *Attorney, Agent, or Firm* — Zhenhai Fu; Frank D. Cimino

(57) ABSTRACT

In one example, a circuit comprises: a current source having a current output; a switch coupled between the current output and a current terminal, the switch having a switch control input; a pulse signal generator having pulse signal outputs, the pulse signal generator configured to provide pulse signals having different pulse widths at the pulse signal outputs; and a multiplexor circuit having pulse signal inputs, a selection input and a selected pulse signal output, the selected pulse signal output coupled to the switch control input, and the pulse signal inputs coupled to the pulse signal outputs.

23 Claims, 16 Drawing Sheets

(56) References Cited

U.S. PATENT DOCUMENTS

| | | | | |
|---|---|---|---|---|
| 10,122,372 | B1* | 11/2018 | Huber | H03M 1/0607 |
| 10,224,949 | B1* | 3/2019 | Li | H03M 1/123 |
| 10,516,412 | B1* | 12/2019 | Mehdizad Taleie | H03M 1/662 |
| 10,541,699 | B1* | 1/2020 | Rutten | H03M 1/1061 |
| 10,756,744 | B1* | 8/2020 | Seckin | H03M 1/68 |
| 11,095,293 | B1* | 8/2021 | Sahu | H03L 7/099 |
| 11,533,068 | B1* | 12/2022 | Sharma | H03M 1/0614 |
| 2005/0052301 | A1* | 3/2005 | Mills | H03M 1/0643 341/144 |
| 2006/0061399 | A1* | 3/2006 | Xu | H03K 5/133 327/287 |
| 2012/0139766 | A1* | 6/2012 | Cyrusian | H03M 1/0845 341/120 |
| 2016/0182079 | A1* | 6/2016 | Worley | H03M 1/68 341/145 |
| 2019/0207616 | A1* | 7/2019 | Chen | H03M 1/1014 |
| 2021/0089272 | A1 | 3/2021 | Jain | |
| 2022/0302840 | A1* | 9/2022 | Assaad | H02M 3/158 |
| 2023/0101518 | A1* | 3/2023 | Bal | H03M 1/0836 341/120 |
| 2023/0238974 | A1* | 7/2023 | Rutten | H03M 1/0621 341/118 |
| 2023/0251943 | A1* | 8/2023 | Dorrance | G06F 11/2041 714/4.11 |
| 2023/0412180 | A1* | 12/2023 | Liu | H03M 1/502 |

OTHER PUBLICATIONS

Baek, Seungbum, "Reconfigurable multiplier architecture based on memristor-cmos with higher flexibility", College of Electrical and Computer Engineering, Chungbuk National University, https://doi.org/10.48550/arXiv.1907.09078, Mon, Jul. 22, 2019 (Year: 2019).

Biswas et al., "CONV-SRAM: An Energy-Efficient SRAM With In-Memory Dot-Product Computation For Low-Power Convolutional Neural Networks," IEEE Journal of Solid-State Circuits, vol. 54, No. 1, Jan. 2019, pp. 217-230.

Biswas et al., "Conv-RAM: An Energy-Efficient SRAM with Embedded Convolution Computation for Low-Power CNN-Based Machine Learning Applications," ISSCC 2018 / Session 31 / Computation in Memory For Machine Learning / 31.1, Feb. 14, 2018, 3 p.

* cited by examiner

DIGITAL TO ANALOG CONVERSION

CROSS-REFERENCE TO RELATED APPLICATIONS

This application claims priority to U.S. Provisional Patent Application No. 63/498,217, titled "A Delay-Locked Loop based timing generation scheme for Digital-to-Analog conversion for Compute-In-Memory macros", filed Apr. 25, 2023, and is related to U.S. patent application Ser. No. 17/162,694, titled "Computation In-Memory Using 6-Transistor Bit cells," filed Jan. 29, 2021, and U.S. Pat. No. 11,551,745, titled "Computation In-Memory Architecture For Analog-to-Digital Conversion," filed Aug. 5, 2021, all of which are incorporated herein by reference in their entireties.

BACKGROUND

Convolutional neural networks (CNN) are a type of neural network designed for processing data. A CNN can include one or more layers, and each layer can generate output data based on dot products between the input data and filter weights of the layer. One way of implementing a CNN is using a compute-in-memory (CIM) memory array. A CIM array can include memory devices to store filter weights of a CNN layer. The CIM array may interface with peripheral circuitries, such as digital to analog converters (DACs) and analog to digital converters (ADCs). For example, DACs can convert digital input data into input analog voltage signals. The CIM array can combine the analog input voltages based on the filter weights to generate output analog voltage signals representing the dot products. The ADCs can convert the output analog voltage signals into digital output data.

Another way of implementing a CNN is using a processor. Weights and input data can be fetched from a memory to the processor, which can perform computations on the weights and input data to generate the dot products. Compared with such arrangements, using a CIM array can reduce the data transmission and computations involved in generating the dot products, which can reduce power consumption. However, the peripheral circuitries, such as the DACs and ADCs, may consume considerable amounts of power.

SUMMARY

In one example, a circuit comprises a current source, a switch, a pulse signal generator, and a multiplexor circuit. The current source has a current output. The switch is coupled between the current output and a current terminal, the switch having a switch control input. The pulse signal generator has pulse signal outputs, and the pulse signal generator is configured to provide pulse signals having different pulse widths at the pulse signal outputs. The multiplexor circuit has pulse signal inputs, a selection input and a selected pulse signal output. The selected pulse signal output is coupled to the switch control input, and the pulse signal inputs coupled to the pulse signal outputs.

In one example, a system includes a compute-in-memory (CIM) array, digital-to-analog converters (DACs), and analog-to-digital converters (ADC). The CIM array has compute inputs and compute outputs. Each DAC has respective pulse signal inputs, a respective digital input, and a respective analog output. The analog outputs of the DACs are coupled to the compute inputs. Each DAC includes a respective current source coupled to a respective current output. Each DAC also includes a respective switch coupled between the respective current output and the respective analog output, the respective switch having a respective switch control input. Each DAC includes a respective multiplexor circuit having the respective pulse signal inputs, a respective selection input coupled to the respective digital input, and a respective selected pulse signal output, the respective selected pulse signal output coupled to the respective switch control input. Each DAC includes a respective pulse signal generator having respective pulse signal outputs coupled to the respective pulse signal inputs, the respective pulse signal generator configured to provide pulse signals having different pulse widths at the respective pulse signal outputs. Each of the ADCs has a respective analog input and a respective digital output, the analog inputs of the ADCs coupled to the compute outputs.

In one example, a method comprises receiving pulse signals having different pulse widths. The method further comprises receiving digital signals representing a value. The method comprises responsive to the digital signals, combining a subset of the pulse signals to generate a combined pulse signal having a pulse width that represents the value. The method further comprises charging a capacitor for an interval based on the combined pulse width to provide a voltage that represents the value.

BRIEF DESCRIPTION OF THE DRAWINGS

The same reference numbers are used in the drawings to designate the same (or similar) features.

DETAILED DESCRIPTION

Figure 1:
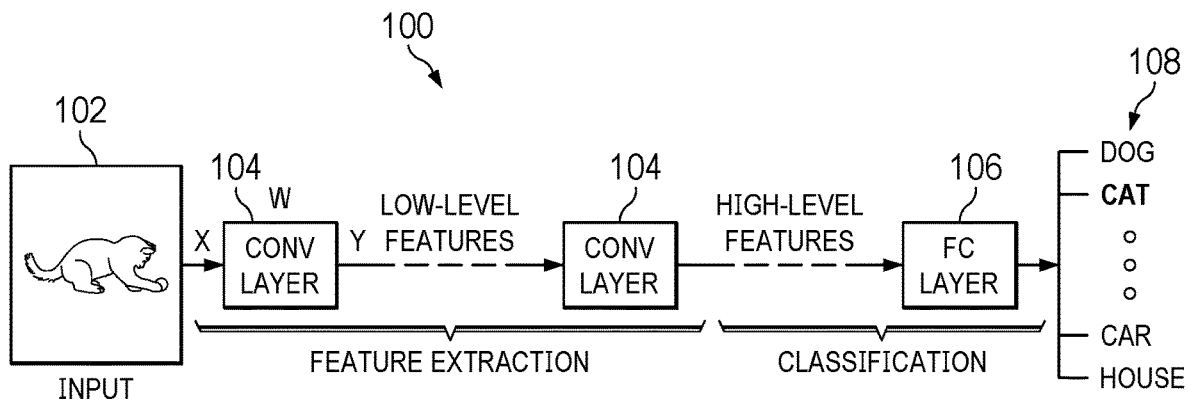
FIG. 1 is a schematic diagram illustrating a convolutional neural network (CNN) in various examples.

FIG. 1 is a schematic diagram illustrating a block diagram of an example convolutional neural network (CNN) 100 computation. In this example, CNN 100 receives input data 102 and performs an inferencing operation on the input data. In the example of FIG. 1, input data 102 can be image data, and CNN 100 can perform the inferencing operation to classify the image.

CNN 100 can include multiple convolutional layers 104. The input data 102 is provided to a first layer of convolutional layers 104. Each convolutional layer 104 includes multiple (digital) filters that are applied to the input data provided to that convolutional layer 104, and each filter includes multiple filter weights. For example, a convolutional layer 104 applies filter weights W to input data X to generate or provide output data Y. In some cases, convolutional layers 104 can generate outputs representing various features extracted from input data 102. The CNN 100 includes a fully connected layer 106 to provide classification 108 of input data 102 based on the features extracted by convolutional layers 104.

Figure 2:
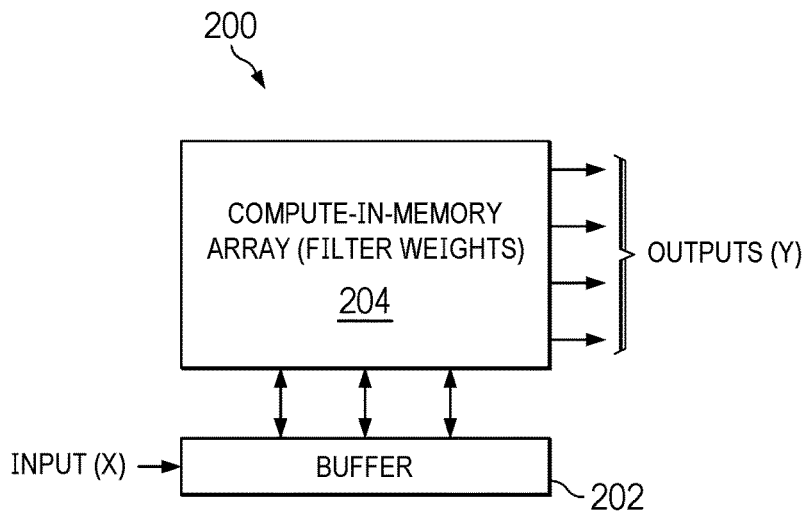
FIG. 2 is a schematic diagram illustrating a memory circuit configured as a compute-in-memory (CIM) array in various examples.

FIG. 2 is a schematic diagram illustrating a block diagram of an example system 200. System 200 can implement at least part of CNN 100. System 200 includes buffer circuitry 202 to receive an input X (e.g., input data 102 or an output provided by a previous layer 104). As described below, the inputs X can be digital signals, and digital-to-analog converters (DACs, not shown in FIG. 2) convert the digital signals to analog voltage ($V_a$) signals, which are then provided to CIM array 204. The DACs can be part of buffer circuitry 202 or can be coupled between buffer circuitry 202 and CIM array 204. CIM array 204 can store filter weights W of a convolutional layer 104 (or a portion of a convolutional layer 104). CIM array 204 can generate dot products by combining the Va signals based on the filter weights W, and provide the dot products as outputs Y. In some examples, the outputs Y are analog voltage signals, while in other examples, the outputs Y are digital signals (e.g., converted from analog voltages using an analog-to-digital converter (ADC)).

Figure 3:
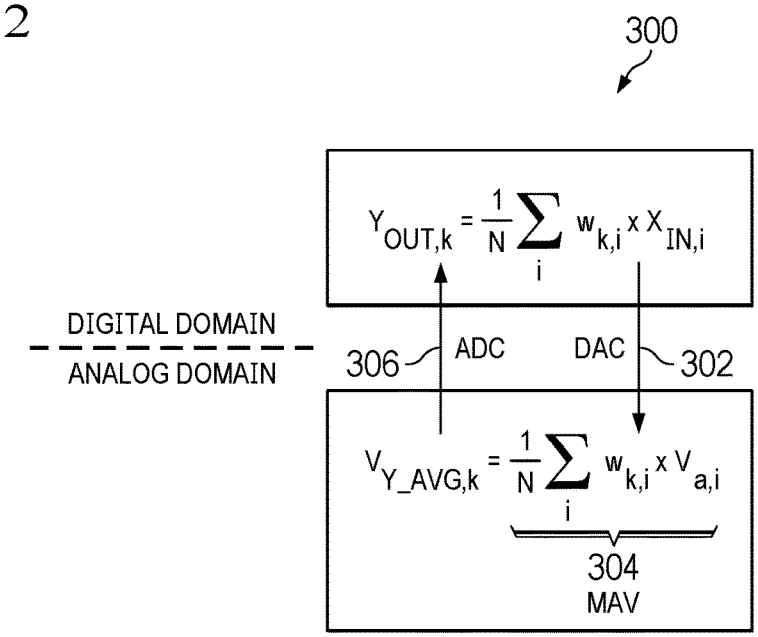
FIG. 3 is a schematic diagram illustrating a dot product operation being applied in digital and analog domains in various examples.

FIG. 3 is a schematic diagram of an example dot product operation 300 that can be performed by system 200. In dot product operation 300, input values $X_{IN}$ are combined with quantized filter weights ($w_k$) to generate digital output values $Y_{OUT}$. Using quantized filter weights (e.g., 16-bit, 8-bit, 4-bit, binary or ternary weight values) reduces the memory used to store the filter weights while maintaining acceptable accuracy. Binary weights are represented by a single bit, while ternary bits are represented by two bits. For example, in a binary weighting scheme, a weight value of −1 is represented by a bit value of 1 and a weight value of +1 is represented by a bit value of 0. In another example, in a ternary weighting scheme, a weight value of −1 is represented by a bit value of 11, a weight value of +1 is represented by a bit value of 00, and a weight value of 0 is represented by either 01 or 10.

Providing digital inputs $X_{IN,i}$ to the CIM array 204 uses a relatively large number of wires (e.g., one wire per bit, with each digital input being multiple bits), introduces routing complexity, and can also increase area of CIM array 204. Accordingly, digital inputs can be converted to analog voltage signals, and each analog voltage signal can be provided to CIM array 204 on a single wire (or a pair of wires for differential signals). The example dot product operation 300 includes a DAC stage 302 that converts the digital input values $X_{IN,i}$ to analog voltage signals $V_{a,i}$.

In some examples, as described above, the filter weights used in the dot product operation can be quantized, such as by factoring out a scaling factor from initial weight values. In these examples, the scaling factor is expressed as a ratio of two integers, M/N, where N is the number of inputs $X_{IN}$ (or $V_a$). In FIG. 2, M is ignored for simplicity because it can be applied to scale a final result (e.g., $Y_{OUT}$), such as by multiplication (e.g., in the digital domain). The example dot product operation 300 also includes a multiply/average (MAV) stage 304 that multiplies each analog voltage signal $V_a$ by a filter weight $w_k$ and then computes the average by summing the products and dividing that sum by N, to generate $V_{Y\_AVG}$. Accordingly, $V_{Y\_AVG}$ can represent a weighted average of multiple analog voltage signals $V_a$. The example dot product operation 300 also includes an ADC stage 306 that converts the analog voltage signals $V_{Y\_AVG}$ to digital output values $Y_{OUT}$.

The example dot product operation 300 performed by system 200 can be more efficient and consume less power than, for example, a case where weights and input data are fetched from a memory to a processor, which then performs computations on the weights and input data to generate the dot products. Specifically, in system 200, weights are stored in CIM array 204, and input data $X_{IN}$ are converted to analog voltage signals $V_a$, which can reduce the number of signals transmitted to CIM array 204, and within CIM array 204, which can reduce the power consumed for data transmission. Moreover, CIM array 204 can include low power circuitry to implement MAV stage 304, which can further reduce the power consumption for the generation of the dot products.

Figure 4:
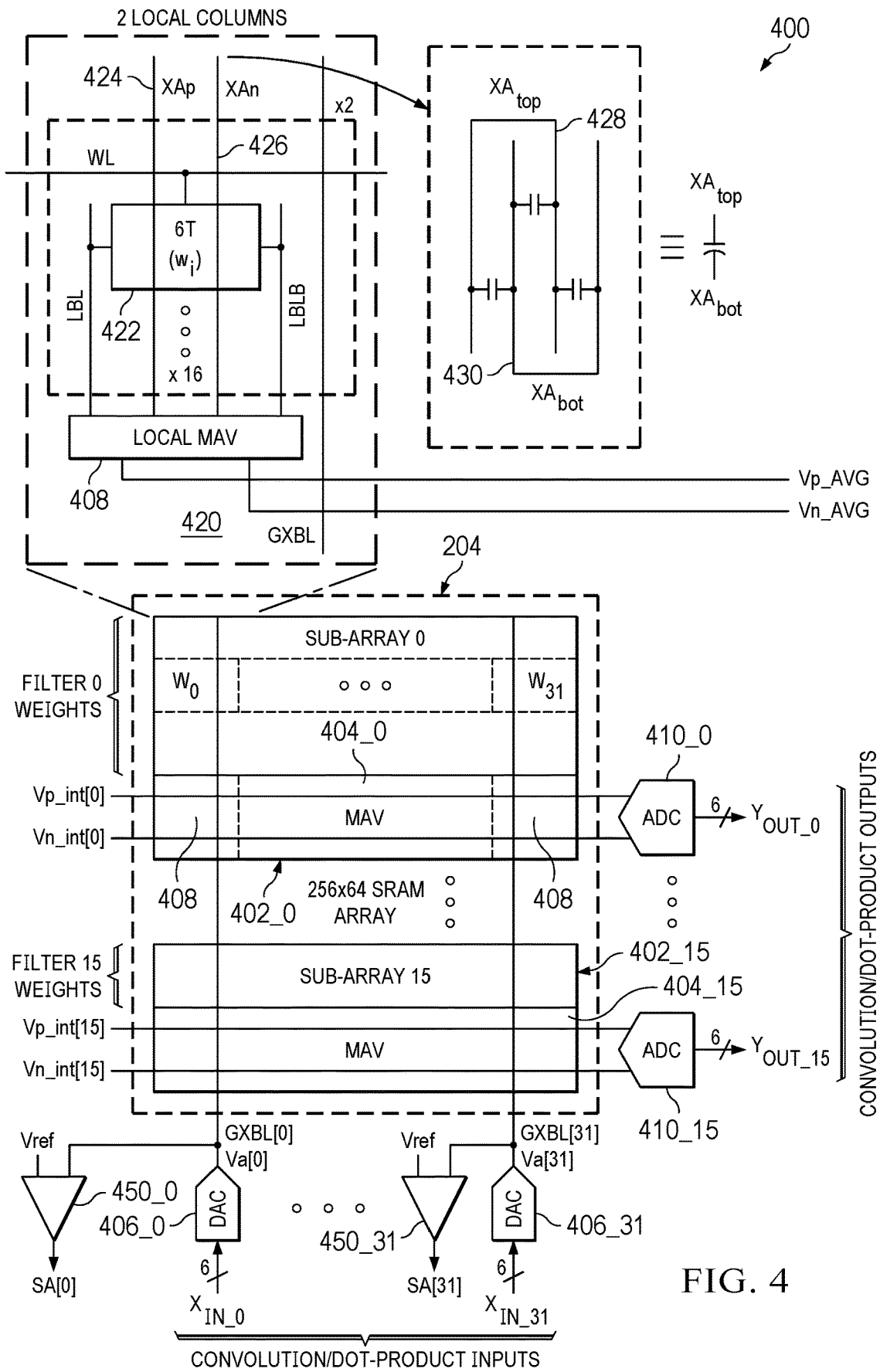
FIG. 4 is a schematic diagram illustrating a system including a CIM array having multiply/average (MAV) circuits in various examples.

FIG. 4 is a schematic diagram of an example system 400 including a CIM array 204. In some examples, system 400 can be on an integrated circuit. CIM array 204 is configured to store filter weights W of a convolutional layer 104 (or a portion of a convolutional layer 104). In the example of FIG. 4, the CIM array 204 includes an array of bit cells arranged in 256 rows and 64 columns. CIM array 204 includes 16 sub-arrays, including sub-arrays 402_0 and 402_15. Each sub-array 402 can have 16 rows and 64 columns of bit cells. Each sub-array 402 can store weights of a filter of the convolutional layer 104. For example, the bit cells in sub-array 402_0 can store Filter 0 weights, and the bit cells in sub-array 402_15 can store Filter 15 weights. In other examples, the size of CIM array 204, the size of the sub-arrays 402, and/or the number of sub-arrays 402 in CIM array 204 can be different from what are described above.

CIM array 204 also includes 16 MAV circuit arrays, including MAV circuit arrays 404_0 and 404_15, each coupled to a respective one of the sub-arrays 402. For example, the MAV circuit array 404_0 is coupled to the sub-array 402_0 and the MAV circuit array 404_15 is coupled to the sub-array 402_15. The MAV circuit arrays 404 can perform operations of the MAV stage 304 as described above. The system 400 includes DACs 406, including DACs 406_0 and 406_31. Each DAC 406 is configured to receive digital signals representing a convolution output or a dot product input (e.g., $X_{IN}$) and provide an analog voltage signal $V_a$ (or differential analog voltage signals) representing a value of the digital signals. As described above, in some examples the digital signals can represent multiple bits. Therefore, the DACs 406 are useful to reduce the wiring to CIM array 204 by providing an analog input (e.g., single wire, or differential wires) rather than a digital input (e.g., multiple wires according to a bit width), which can also reduce the number of signals being transmitted within CIM array 204 and the power consumption of data transmission. Further, in the example of FIG. 4, power consumed by the DACs 406 is also reduced due to each DAC 406 driving a single wire (or differential wires) rather than multiple wires each representing a particular bit.

As described above, in the example of FIG. 4, CIM array 204 has 64 columns of bit cells. However, in some examples, bit cells in a row can be grouped into pairs, such as to implement a ternary weighting scheme where the grouped pair of bit cells represents a ternary filter weight. Grouping bit cells in a row into pairs effectively reduces the number of columns in the CIM array 204 by half (e.g., CIM array 204 has 32 effective columns). As described below, each MAV circuit array 404 includes a local MAV circuit 408 for each of the 32 effective columns of the CIM array 204 (or sub-array 402). In the example of FIG. 4, each of 32 DACs 406 is coupled to the local MAV circuits 408 in a column of the CIM array 204 (e.g., by interconnect GXBL) to provide an analog voltage signal to local MAV circuits 408 in a column of the CIM array 204 (or sub-array 402).

For example, in FIG. 4, GXBL[0] couples a DAC 406_0 output to the local MAV circuit 408 in column 0 of the MAV circuit array 404_0 for Filter 0, to the local MAV circuit 408 in column 0 of the MAV circuit array 404_15 for Filter 15, and to the local MAV circuits 408 in column 0 of the MAV circuit arrays 404 for Filters 1-14, which are not shown for simplicity. Similarly, GXBL[31] couples a DAC 406_31 output to the local MAV circuit 408 in column 31 of the MAV circuit array 404_0 for Filter 0, to the local MAV circuit 408 in column 31 of the MAV circuit array 404_15 for Filter 15, and to the local MAV circuits 408 in column 31 of the MAV circuit arrays 404 for Filters 1-14, which are not shown for simplicity. Other DACs 406, which are also not shown for simplicity, similarly provide analog voltage inputs to local MAV circuits 408 in the other columns of the CIM array 204.

The system 400 also includes ADCs 410, such as ADCs 410_0 and 410_15, each of which is configured to receive a pair of differential analog voltages (e.g., Vp and Vn) from a MAV circuit array 404 via Vp_int and Vn_int interconnects. The differential analog voltages received from a MAV circuit array 404 represent an average of the products of multiplying the analog voltage inputs $V_a$ from the DACs 406 with filter weights $w_k$ in the sub-array 402 (e.g., in a row of the sub-array 402) coupled to the MAV circuit array 404. The ADCs 410 are configured to provide a digital output $Y_{OUT}$ that indicates a value of the received differential analog voltages (e.g., Vp minus Vn). In examples of this description, the ADCs 410 providing the digital output responsive to the received differential analog voltages reduces the impact of common mode noise on the calculation of the digital output $Y_{OUT}$. The digital output $Y_{OUT}$ can represent a convolution or dot product output.

As described above, in the example of FIG. 4, the CIM array 204 has 256 rows of bit cells with 16 sub-arrays 402 that each includes 16 rows of bit cells. The MAV circuit array 404 for each sub-array 402 is thus configured to receive analog voltage inputs $V_a$ from the DACs 406, multiply each analog voltage signal $V_a$ with a filter weight $w_k$ in one of the rows of the sub-array 402, and provide the differential analog voltage signals that are an average of the products of each analog voltage signal $V_a$ with the filter weight $w_k$ in one of the rows of the sub-array 402. An ADC 410 receives the differential analog voltage signals from the MAV circuit array 404 and provides the digital output $Y_{OUT}$ as the convolution or dot product output. The ADCs 410 are thus configured to facilitate the ADC stage 306, described above.

FIG. 4 also illustrates an expanded portion 420 of a column of a sub-array 402 including the local MAV circuit 408 for that column. The expanded portion 420 includes 16 rows of bit cells 422. The bit cells 422 can be 6T bit cells (as shown in FIG. 4) or other types of bit cells, such as 8T and 10T bit cells. As described above, the bit cell 422 stores a filter weight wk. There is only one column of bit cells 422 in this example (e.g., to implement a binary weighting scheme). However, as described above, in other examples bit cells 422 in a row are grouped into pairs, such as to implement a ternary weighting scheme where the grouped pair of bit cells 422 represents a ternary filter weight.

The expanded portion 420 also includes a first capacitor 424 and a second capacitor 426 that are shared by the effective column of the sub-array 402. The first and second capacitors 424, 426 are coupled to the local MAV circuit 408. The first and second capacitors 424, 426 are fabricated on a metal layer that is separate from (e.g., above) a layer on which the 6T bit cell 422 is fabricated, and do not significantly add to the area of the sub-array 402 or the CIM array 204. In the example of FIG. 4, the second capacitor 426 is shown in detail as a metal top plate 428 and a metal bottom plate 430 that can be fabricated on the metal layer above the bit cell 422. In an example, the top plate 428 and the bottom plate 430 are fabricated on the same metal layer above the bit cell 422 and the capacitance provided by the first and second capacitors 424, 426 is primarily metal-to-metal wire capacitance. In other examples, multiple metal layers above the bit cell 422 are available for fabrication, and one or more of the first and second capacitors 424, 426 are implemented as parallel capacitors on the multiple metal layers. Each effective column of the sub-arrays 402 includes first and second capacitors 424, 426.

The expanded portion 420 includes a first local bit line (LBL) and a second local bit line (LBLB) between the local MAV circuit 408 and the bit cells 422 in the column. In an example, the local bit lines LBL, LBLB are complementary. The expanded portion 420 also includes a word line (WL) that is coupled to each bit cell 422 in a particular row. As described below, the word line WL is activated (e.g., driven to logic high) to access (e.g., read from or write to) the bit cell 422. Examples of this description are generally directed to reading from the bit cell 422, such as to multiply an analog voltage input $V_a$ by a filter weight $w_k$ stored in the bit cell 422. To read from the bit cell 422, the local bit lines LBL, LBLB are pre-charged (e.g., to a supply voltage (Vdd)) and the word line WL is subsequently activated. One of the local bit lines is discharged responsive to the value stored in the bit cell 422. For example, responsive to the bit cell storing a 1, the bit line LBLB is discharged; responsive to the bit cell storing a 0, the bit line LBL is discharged.

The local MAV circuit 408 is configured to receive the analog voltage input $V_a$ from the GXBL interconnect and, during a DAC pre-charge stage, to couple the GXBL interconnect to the first and second capacitors 424, 426 to charge the first and second capacitors 424, 426 to $V_a$. For example, the top plate 428 of each of the capacitors 424, 426 is charged to $V_a$ and the bottom plate 430 of each of the capacitors 424, 426 is coupled to a ground terminal. As described below, the local MAV circuit 408 is configured to discharge one of the first and second capacitors 424, 426 responsive to one of the bit lines LBL, LBLB being discharged responsive to the bit cell 422 being read. For example, the first capacitor 424 represents a positive voltage (XAp=$V_a$) and the second capacitor 426 represents a negative voltage (XAn=−$V_a$). Accordingly, responsive to the bit cell 422 storing a 1, which corresponds to a filter weight value of −1, the first capacitor 424 (corresponding to $V_a$) is discharged and the second capacitor 426 (corresponding to −$V_a$) remains charged. The capacitor 424, 426 that remains charged thus represents the product of $V_a*w_k$.

In examples of this description, the first and second capacitors 424, 426 store the variable analog voltage input $V_a$ without providing the analog voltage input to the bit cell 422 itself. This prevents the value (e.g., filter weight) stored in the bit cell 422 from being corrupted, such as by the application of a relatively low analog voltage to the bit cell 422 (e.g., to the bit lines LBL, LBLB). Also, variations that impact the transistors of the bit cell 422 do not impact the charge on the first and second capacitors 424, 426. Accordingly, the product of $V_a*w_k$ computed by the local MAV circuit 408 discharging one of the capacitors 424, 426 (e.g., to a ground voltage) is also not affected by variations in the bit cell 422 transistors.

After the local MAV circuits 408 have computed the product of $V_a*w_k$ for each column, the local MAV circuit 408 is configured to couple the first capacitor 424 (e.g., the top plate 428 of the first capacitor 424) for each column to the Vp_AVG interconnect, and to couple the second capacitor 426 (e.g., the top plate 428 of the second capacitor 426) for each column to the Vn_AVG interconnect. Accordingly, the first capacitors 424 for each column are coupled in parallel while the second capacitors 426 for each column are coupled in parallel. This has the effect of averaging the voltages on the first capacitors 424 from each column and providing the averaged voltage on the Vp_AVG interconnect. Similarly, this has the effect of averaging the voltages on the second capacitors 426 from each column and providing the averaged voltage on the Vn_AVG interconnect. As described below, the ADCs 410 are configured to provide digital outputs $Y_{OUT}$ each indicating a value of the received differential analog voltages (e.g., Vp minus Vn). For example, ADC 410_0 receives differential analog voltages Vp[0] and Vn[0] from sub-array 402_0 via interconnects Vp_int[0] and Vn_int[0] and generates $Y_{OUT\_0}$. Also, ADC 410_15 receives differential analog voltages Vp[15] and Vn[15] from sub-array 402_15 via interconnects Vp_int[15] and Vn_int[15] and generates $Y_{OUT\_15}$.

As described above, having DACs 406 to convert digital signals (e.g., $X_{IN\_0}$ and $X_{IN\_31}$) to analog voltage signals (e.g., $V_a[0]$ and $V_a[31]$), and transmitting the analog voltage signals to CIM array 204, can reduce the number of wires and signals being transmitted within CIM array 204, which can reduce power consumption within CIM array 204. Also, having each DACs 406 to drive a single wire GXBL (or a pair of differential wires), rather than a set of wires representing the bit width of digital signals $X_{IN}$, the power consumption at the DACs 406 can also be reduced. However, because system 400 includes a large number of DACs 406 to drive the GXBL wires (e.g., 32 in FIG. 4), it is desirable to reduce the power consumption of each of DACs 406 to further improve the power efficiency of system 400.

In some examples, CIM array 204 can also operate in a memory mode. In such memory mode, the array of bit cells of CIM array 204 can be part of a static random access memory (SRAM) array. System 400 may also include sense amplifiers 450 coupled to the GXBL interconnects, such as sense amplifier 450_0 coupled to GXBL[0] and sense amplifier 450_31 coupled to GXBL[31]. When operating in memory mode, the bit cells can operate as SRAM bit cells, and the data stored in the bit cells can be read using sense amplifier 450. For example, sense amplifier 450_0 can provide a read out of a bit cell in the first column of CIM array 204 by comparing the GXBL[0] voltage with a reference voltage VREF and generate a sense amplifier output SA[0]. Also, sense amplifier 450_31 can provide a read out of a bit cell in the first column of CIM array 204 by comparing the GXBL[31] voltage with a reference voltage VREF and generate a sense amplifier output SA[31].

Figure 5:
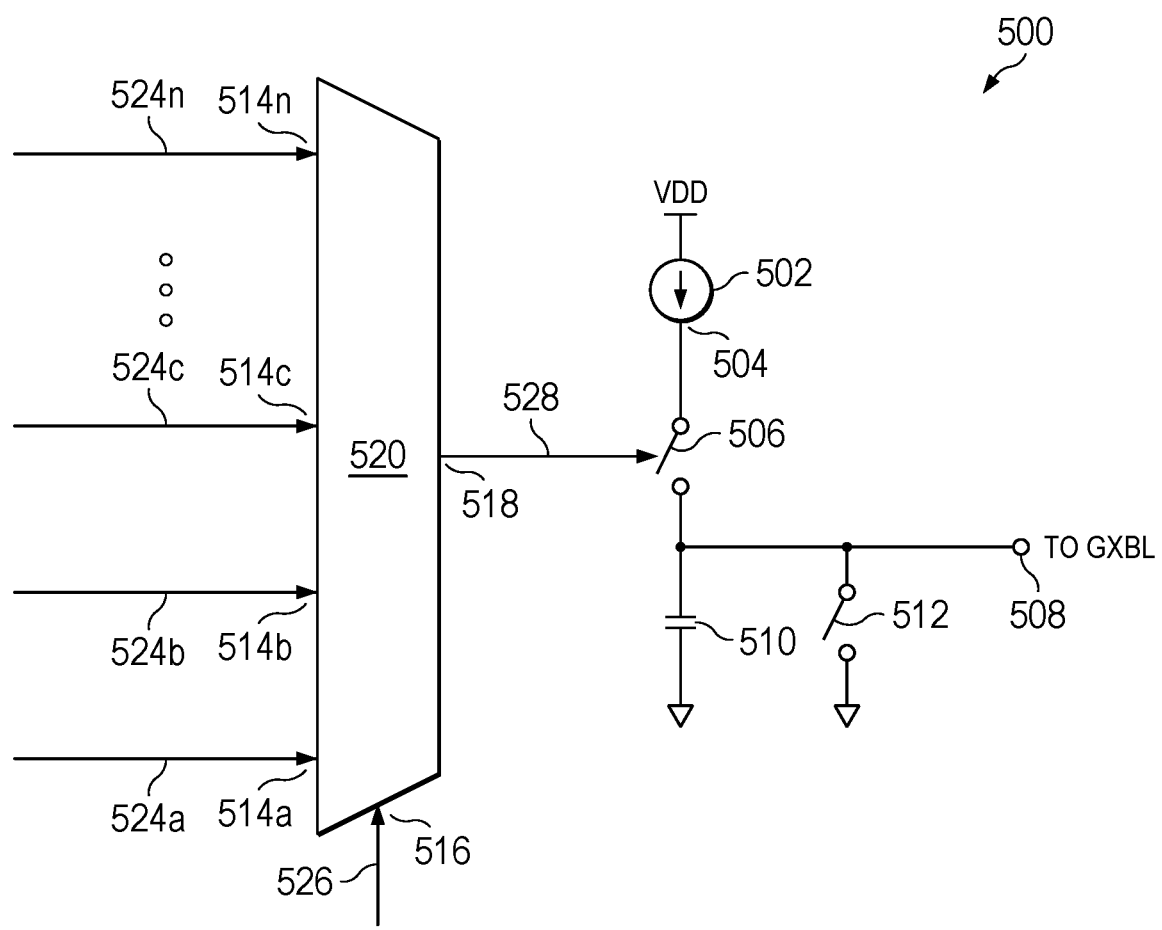
FIG. 5 is a schematic diagram illustrating a digital to analog converter (DAC) that can be part of the system of FIG. 4 in various examples.

FIG. 5 is a schematic diagram of an example DAC 500 that can be part of DAC 406 (e.g., DACs 406_0 and 406_31) of FIG. 4. Referring to FIG. 5, DAC 500 includes a current source 502 having a current output 504, a switch 506 coupled between current output 504 and a current terminal 508, the switch having a switch control input. Switch 506 can include, for example, field effect transistors (FETs), bipolar junction transistors (BJTs), etc. Current terminal 508 can be coupled to a GXBL wire, such as GXBL[0] and GXBL[31] of FIG. 4. Current terminal 508 can also be coupled to a capacitor 510, which can be part of DAC 500 or can be external to DAC 500 (e.g., being part of CIM array 204). DAC 500 can also include a reset switch 512 coupled between current terminal 508 and ground.

Current source 502 can provide a current $I_{DAC}$. Within a conversion interval, switch 506 can be enabled for a duration of $T_{ON}$. Within the duration, capacitor 510 can be charged by the current $I_{DAC}$, and the voltage at current terminal 508 can be given by:

$$V_{508} = \frac{I_{DAC} \times T_{ON}}{C_{510}} \quad \text{(Equation 1)}$$

DAC 500 can perform a digital-to-analog conversion operation by setting the duration $T_{ON}$ based on input digital signals (e.g., $X_{IN}$), so that the magnitude of the voltage $V_{508}$ at current terminal 508 can represent the value of the digital signals. At the end of the conversion interval, DAC 500 can enable switch 512 to reset the voltage $V_{508}$ to zero, and then DAC 500 can perform another digital-to-analog conversion operation in a subsequent conversion cycle.

DAC 500 includes a multiplexor circuit 520 to set the duration $T_{ON}$. Multiplexor circuit 510 has pulse signal inputs 514, such as pulse signal input 514a, 514b, 514c, and 514n. Multiplexor circuit 520 also includes a digital input 516 and a control output 518. Multiplexor circuit 520 can receive pulse signals 524a, 524b, 524c, and 524n at, respectively, pulse signal inputs 514a, 514b, 514c, and 514n. The pulse signals can have different pulse widths within a conversion interval in which DAC 500 performs the digital to analog conversion, and at least one of the pulse signals can have a zero pulse width within the conversion interval. As to be described below, the pulse signals can be provided by a pulse signal generator, which can include a delay locked loop (DLL), and the rising edges and falling edges of the pulse signals are separated by multiples of unit intervals, where each unit interval can be a phase shift/delay provided by a delay cell of the DLL. The unit interval can also correspond to a step size of the digital to analog conversion provided by DAC 500 based on Equation 1. Multiplexor circuit 520 can receive digital signals 526 (e.g., $X_{IN}$) at digital input 516. Multiplexor circuit 520 can combine one of more of pulse signals 524a-n based on digital signals 526 to generate a control signal 528 at control output 518. Control signal 528 can have a pulse width that represents the value of digital signals 526 and sets the duration $T_{ON}$.

DAC 500 can provide reduced power consumption. Compared with a DAC that includes a set of segmented current sources and performs digital to analog conversion by combining the currents from the segmented current sources, DAC 500 includes a single current source and performs digital to analog conversion by controlling the time the current source charges a capacitor. The reduced number of current sources can reduce power consumption and area.

Also, various performance metrics of DAC 500, such as step size and gain, can be controlled by setting the pulse widths of pulse signals 524a, 524b, 524c, and 524n, and by setting the rising/falling edges separations between the pulse signals. As to be described below, the DLL can be calibrated to compensate for variations in the current $I_{DAC}$ provided by current source 502 to maintain the same step size and gain across PVTs, instead of or (or in addition to) calibrating the amount of current $I_{DAC}$ provided by current source 502. With such arrangements, additional segmented current sources can be omitted, or at least reduced, to support the calibration operation, which can reduce the hardware and power consumption involved in the calibration operation.

Figure 6A:
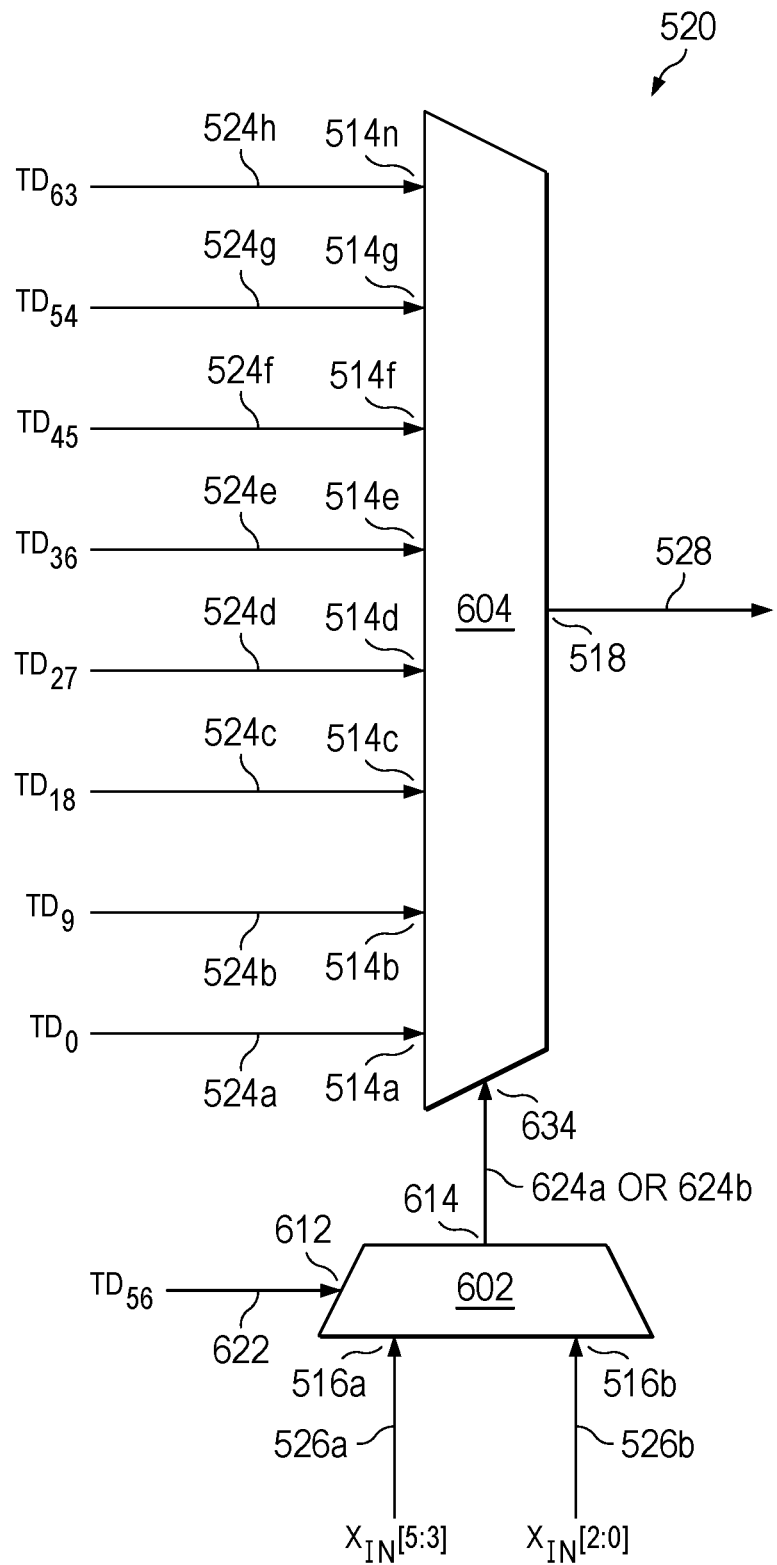
FIG. 6A is a schematic diagram illustrating internal components of the DAC of FIG. 5 in various examples.
Figure 6B:
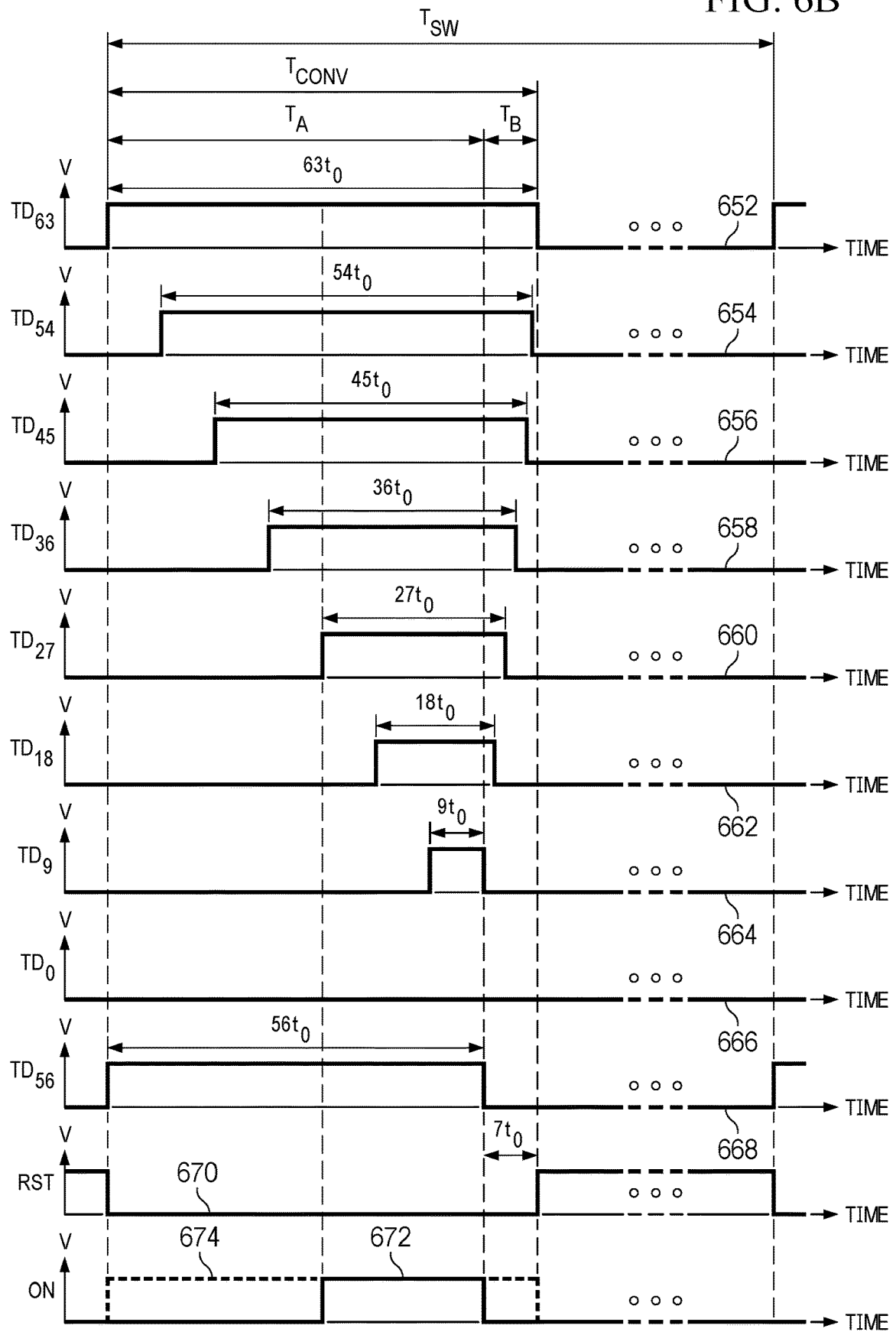
FIG. 6B includes graphs illustrating operations of the DAC of FIG. 5 in various examples.

FIG. 6A is a schematic that illustrates example internal components of multiplexor circuit 520, and FIG. 6B are graphs that illustrate examples of pulse signals 524a-n. Referring to FIG. 6A, multiplexor circuit 520 can include a first multiplexor subcircuit 602 and a second multiplexor subcircuit 604. First multiplexor subcircuit 602 have digital input 516 (including digital input 516a and digital input 516b in FIG. 6A), a phase selection input 612, and a selection output 614. Responsive to a state of a pulse signal 524n (also labelled $TD_{56}$) at phase selection input 612, first multiplexor subcircuit 602 can provide one of two sets of selection signals 624a and 624b at selection output 614. the first set of selection signals 624a representing N number of most significant bits (MSBs) of digital signals 526 ($X_{IN}$), and the second set of selection signals 624 representing N number of least significant bits (LSBs) of digital signals 526. In the example of FIG. 6A, digital signals 526 has 6 bits. Accordingly, the first set of selection signals 624 can represent the 3-bit MSBs $X_{IN}$[5:3], and the second set of selection signals 624 represents the 3-bit LSBs $X_{IN}$[2:0].

Also, second multiplexor subcircuit 604 has a pulse signal selection input 634 coupled to select output 614, pulse signal inputs 514, and control output 518. In the example of FIG. 6A, second multiplexor circuit 604 has eight pulse signal inputs 514a, 514b, 514c, 514d, 514e, 514f, 514g, and 514n to receive, respectively, pulse signals 524a (also labelled $TD_0$), 514b (also labelled $TD_9$), 524c (also labelled $TD_{18}$), 524d (also labelled $TD_{27}$), 514c (also labelled $TD_{36}$), 524f (also labelled $TD_{45}$), 524g (also labelled $TD_{54}$), and 524h (also labelled $TD_{63}$). Pulse signal 524a ($TD_0$) can have zero pulse width within at least the conversion interval. During the first conversion phase, second multiplexor subcircuit 604 can select one of pulse signals 524 as control signal 528 at control output 518 based on the 3-bit selection signal 624a. Also, during the second conversion phase, second multiplexor subcircuit 604 can select one of pulse signals 524a-h as control signal 528 at control output 518. The pulse signals 524a-h selected in the two different conversion phases can be the same pulse signal or a different pulse signal, and the total pulse width of the pulse signals selected in the two conversion phases can set the duration $T_{ON}$ and can represent the value of digital signals 526 ($X_{IN}$). Also, the first and second conversion phases can be continuous in time (or overlap in time) so that the pulse signals 524a-h selected in the two different conversion phases merge into one continuous pulse signal. Because the switching of switch 506 can inject charge into capacitor 510 and introduce non-idealities in the digital to analog conversion operation, merging the pulse signals 514 into one continuous pulse signal (within a conversion interval) can reduce the switching and improve the accuracy of the digital to analog conversion operation.

FIG. 6B includes graphs that illustrate examples of signals provided to and by DAC 500. In FIG. 6B, graph 652 represents the voltage variation of pulse signal $TD_{63}$ with time, graph 654 represents the voltage variation of pulse signal $TD_{54}$ with time, graph 656 represents the voltage variation of pulse signal $TD_{45}$ with time, graph 658 represents the voltage variation of pulse signal $TD_{36}$ with time, graph 660 represents the voltage variation of pulse signal $TD_{27}$ with time, graph 662 represents the voltage variation of pulse signal $TD_{18}$ with time, graph 664 represents the voltage variation of pulse signal $TD_9$ with time, graph 666 represents the voltage variation of pulse signal $TD_0$ with time, and graph 668 represents the voltage variation of pulse signal $TD_{56}$ with time. Also, graph 670 represents the voltage variation of a reset signal (RST) provided to reset switch 512, graph 672 represents the voltage variation of an example control signal 528 generated for a first $X_{IN}$, and graph 674 represents the voltage variation of another example control signal 528 generated for a second $X_{IN}$.

Referring to FIG. 6B, pulse signals $TD_0$-$TD_{63}$ can having a same switching cycle TSW, which can include a conversion interval $T_{CONV}$. Conversion interval $T_{CONV}$ can include a first phase interval $T_A$ and a second phase interval $T_B$. Pulse signals $TD_0$-$TD_{63}$ includes pulse signal $TD_0$ that is in the logical zero state within the conversion interval $T_{CONV}$ and has no pulse width, and pulse signals $TD_9$, $TD_{18}$, $TD_{27}$, $TD_{36}$, $TD_{45}$, $TD_{54}$, and $TD_{63}$ each having different pulse widths across phase intervals $T_A$ and $T_B$, where first transition edges (e.g., rising edges) are within the first phase interval $T_A$ and second transition edges (e.g., falling edges) are within the second phase interval $T_B$. The first transition edges of these pulse signals are evenly spaced apart by an interval equal to a multiple of unit intervals to, and the second transition edges are evenly spaced apart by an interval equal to $t_0$, where to can represent a minimum time resolution of the pulse signal generator (e.g., DLL) that generate the pulse signals and can correspond to a step size of DAC 500. In the example of FIG. 6B, the pulse widths of these pulse signals can be given by the following Equation:

$$TD_{9k} = 8 \times k_a \times t_0 + k_b \times t_0, k_a \text{ and } k_b: 0, 1, \ldots, 7 \quad \text{(Equation 2)}$$

In Equation 2, each of $k_a$ and $k_b$ represents an integer from 0 to 7. The first term in Equation 2 can provide the pulse width in the first phase interval $T_A$, and the second term in Equation 2 can provide the pulse width in the second phase interval $T_B$. Within the first phase interval $T_A$, the rising edges are evenly spaced apart by an interval equal to 8×$t_0$, which reflects the difference in value between consecutive numbers representing the 3-bit MSBs of $X_{IN}$ (8). Also, within the second phase interval $T_B$, the falling edges are evenly spaced apart by to, which reflects the difference in value between consecutive numbers representing the 3-bit LSBs of $X_{IN}$ (1).

Table 1 below illustrates the pulse widths of each pulse signal in the first phase interval $T_A$ and in the second phase interval $T_B$.

TABLE 1

| Pulse signal | First phase interval TA | Second phase interval TB |
|---|---|---|
| $TD_0$ | 0 | 0 |
| $TD_9$ | $8t_0$ | $t_0$ |
| $TD_{18}$ | $16t_0$ | $2t_0$ |
| $TD_{27}$ | $24t_0$ | $3t_0$ |
| $TD_{36}$ | $32t_0$ | $4t_0$ |
| $TD_{45}$ | $40t_0$ | $5t_0$ |
| $TD_{54}$ | $48t_0$ | $6t_0$ |
| $TD_{63}$ | $56t_0$ | $7t_0$ |

Also, the value of digital signals 526 ($X_{IN}$) can be represented by the following Equation:

$$X_{IN} = 8 \times k_A + k_B \quad \text{(Equation 3)}$$

In Equation 3, $K_A$ is a number representing the 3-bit MSBs of $X_{IN}$ ($X_{IN}[5:3]$) and $k_B$ is a number representing the 3-bit LSBs of $X_{IN}$ ($X_{IN}[2:0]$).

First multiplexor subcircuit 602 can receive pulse signal 524n ($TD_{56}$), which has a pulse width that aligns with the first phase interval $T_A$. Responsive to $TD_{56}$ indicating the first interval $T_A$ (e.g., $TD_{56}$ having the logical one state), first multiplexor subcircuit 602 can provide selection signals 624a representing $k_A$, and second multiplexor subcircuit 602 can select one of $TD_0$-$TD_{63}$ according to the value of $k_A$. Also, responsive to $TD_{56}$ indicating the second phase interval $T_B$ (e.g., $TD_{56}$ having the logical zero state), first multiplexor subcircuit 602 can provide selection signals 624b representing kg, and second multiplexor subcircuit 602 can select one of $TD_0$-$TD_{63}$ according to the value of kg. Referring to graph 672, for $X_{IN}$ of 24 (011000'b), second multiplexor subcircuit 604 can select $TD_{27}$ (for $X_{IN}[5:3]$ of 011'b) in the first phase interval $T_A$ and select $TD_0$ (for $X_{IN}[2:0]$ of 000'b) in the second phase interval $T_B$. Also, referring to graph 674, for $X_{IN}$ of 63 (111111'b), second multiplexor subcircuit 604 can select $TD_{63}$ (for $X_{IN}[5:3]$ of 111'b) in the first phase interval $T_A$ and select $TD_7$ (for $X_{IN}[2:0]$ of 111'b) in the second phase interval $T_B$. In each of graphs 672 and 674, control signal 528 has a single pulse within the conversion interval $T_{CONV}$, and the pulse width of the single pulse can define the $T_{IN}$ interval in which switch 506 is turned on and capacitor 510 is charged by the current $I_{DAC}$ from current source 502. After the second phase interval $T_B$ ends, DAC 500 can assert the reset signal to enable reset switch 112 and reset capacitor 510.

In the examples illustrated in FIGS. 6A and 6B, $X_{IN}$ has 6 bits, and multiplexor circuit 502 receives eight pulse signals and select one of the eight pulse signals as control signal 528 based on the 3-bit MSB in the first phase interval $T_A$ and the 3-bit LSB in the second phase interval $T_B$. In a case where $X_{IN}$ has N bits with N being an even number, multiplexor circuit 502 can receive $2^{N/2}$ pulse signals, and the pulse widths of the pulse signals can be based on the following Equation:

$$TD_{((N/2)+1)+k} = 2^{N/2} \times kt_0 + kt_0, k: 0, 1, \ldots, N/2 \quad \text{(Equation 4)}$$

The first transition edges (e.g., rising edges) of the pulse signals can be evenly spaced apart by $2^{N/2} \times kt_0$ in the first phase interval $T_A$, and the second transition edges (e.g., falling edges) of the pulse signals can be evenly spaced apart by to in the second phase interval $T_B$.

Figure 7:
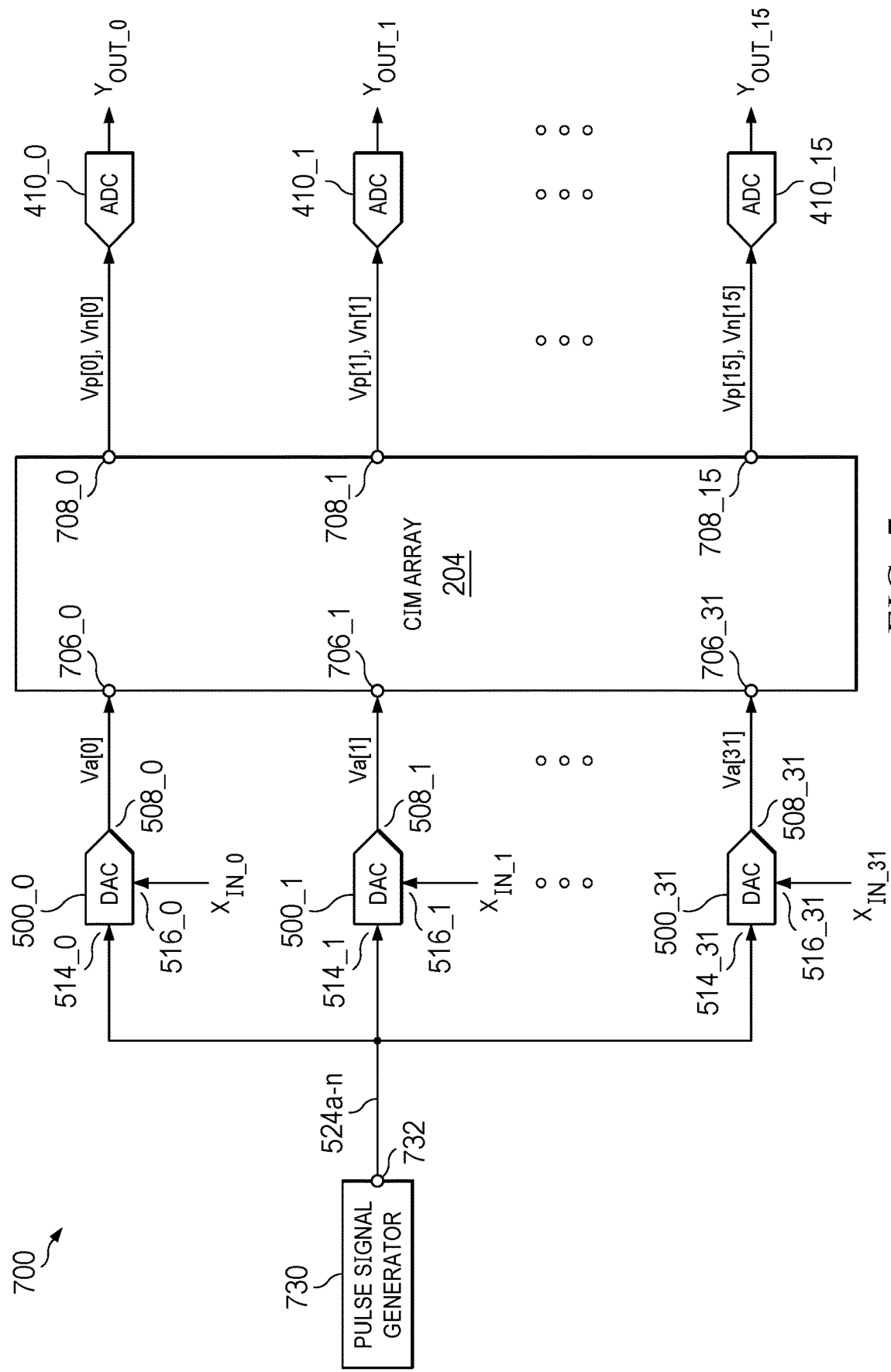
FIG. 7 is a schematic diagram illustrating a system including a pulse signal generator, a CIM array, and the DACs of FIG. 5 in various examples.

FIG. 7 illustrates an example system 700 including DACs 500 of FIG. 5 and CIM array 204 and ADCs 410 of FIGS. 1-4. In some examples, system 700 can be on an integrated circuit. Referring to FIG. 7, system 700 can include 32 DAC 500s, including DACs 500_0, 500_1, and 500_31. CIM array 204 can include processing inputs 706_0, 706_1, and 706_31 coupled to, respectively, wires GXBL[0], GXBL[1], and GXBL[31]. DAC 500_0 has digital input 516_0 to receive digital signals $X_{IN\_0}$, and current terminal 508_0 coupled to processing input 706_0. DAC 500_1 has digital input 516_1 to receive digital signals $X_{IN\_1}$, and current terminal 508_1 coupled to processing input 706_1. Also, DAC 500_31 has digital input 516_31 to receive digital signals $X_{IN\_31}$, and current terminal 508_31 coupled to processing input 706_31. DAC 500_0 can convert $X_{IN\_0}$ to analog voltage $V_a[0]$ and provide $V_a[0]$ to processing input 706_0. DAC 500_1 can convert $X_{IN\_1}$ to analog voltage $V_a[1]$ and provide $V_a[1]$ to processing input 706_1. Further, DAC 500_31 can convert $X_{IN\_31}$ to analog voltage signals $V_a[31]$ and provide $V_a[31]$ to processing input 706_31.

Also, CIM array 204 can include processing outputs 708_0, 708_1, and 708_15 each including, respectively, interconnects Vp_AVG[0] and Vn_AVG [0], interconnects Vp_AVG[1] and Vn_AVG [1], and interconnects Vp_AVG [15] and Vn_AVG [15]. As described above, CIM array 204 can generate differential averaged voltage signals Vp[0] and Vn[0], Vp[1] and Vn[1], Vp[15] and Vn[15], etc., based on analog voltage signals $V_a[0]$-$V_a[31]$ provided by DACs 500_0-500_31 and filter weights 1-15, and provide the differential averaged voltage signals at processing outputs 708_0-708_15. ADCs 410_0, 410_1, and 410_15 can convert the differential averaged voltage signals to, respectively, digital signals $Y_{OUT\_0}$, $Y_{OUT\_1}$, and $Y_{OUT\_15}$.

Further, system 700 includes a pulse signal generator 730 having pulse signal outputs 732 coupled to pulse signals input 514 of each DAC 500, such as pulse signals inputs 514_0, 514_1, and 514_31. Pulse signal generator 730 can provide pulse signals 524a-n at pulse signal outputs 732, and each DAC 500 can receive the same set of pulse signals 524a-n (or identical copies of pulse signals 524a-n) at its pulse signals input 514. Such arrangements allow the multiplexor circuit 520 of each DAC 500 to generate control signal 518 using the same set of pulse signals 524a-n (or copies of pulse signals 524a-n having the same sets of pulse widths), which allows DACs 500 to convert from digital signals 526 to the duration Ton (and analog voltage $V_a$) according to a same relationship and reduces the gain error among DACs 500.

Figure 8:
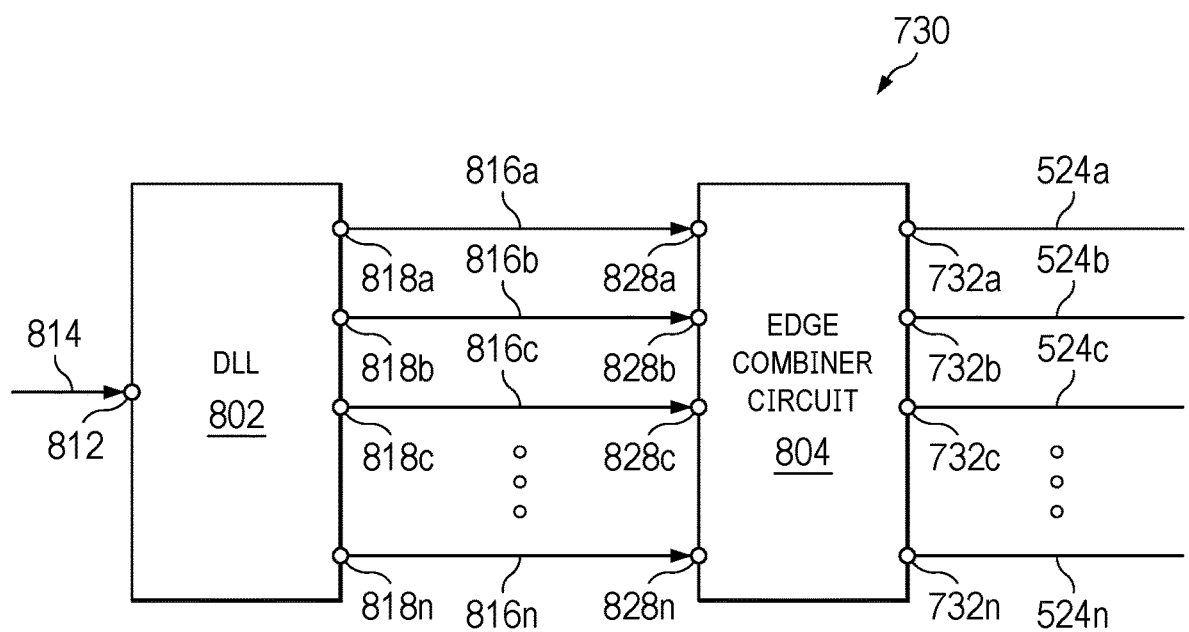
FIG. 8 is a schematic diagram illustrating internal components of the pulse signal generator of FIG. 7 in various examples.

FIG. 8 illustrates example internal components of pulse signal generator 730. Referring to FIG. 8, pulse signal generator 730 can include a DLL 802 and an edge combiner circuit 804. DLL 802 can include a reference clock input 812 to receive a reference clock signal 814. DLL 802 can include a delay chain including multiple delay cells, where each delay cell is a variable delay cell and adds a phase shift/delay to reference clock signal 814 as reference clock signal 814 propagates through the delay chain. DLL 802 can provide phase shifted clock signals 816 including, for example, phase shifted clock signals 816a, 816b, 816c, and 816n at, respectively, DLL outputs 818a, 818b, 818c, and 818n.

DLL 802 also includes a feedback loop. The feedback loop can set a total phase shift added to reference clock signal 814 by the entire delay chain to, for example, one cycle period of reference clock signal 814, which also sets the phase shift/delay introduced by each delay cell. In some examples, the delay of each delay cell can be set by a bias current and/or a capacitive load of the delay cell. The feedback loop can set the bias current and/or capacitive load of each delay cell based on a target total delay of the delay chain. For example, the feedback loop can set the bias current and/or capacitive load of each delay cell so that the total phase shift/delay introduced by the entire delay chain, and the phase shift introduced by each delay cell, constant across different PVTs. As to be described below, the pulse widths of pulse signals 524a-n are based on the delay/phase shift introduced by each delay cell. Accordingly, the DLL can provide the same set of pulse widths for pulse signals 524a-n across different PVTs. This allows DAC 500 to convert digital signals 526 to the duration $T_{ON}$ (and analog voltage $V_a$) by the same relationship across different PVTs and reduces the gain error of DAC 500 due to PVT variations.

Also, edge combiner circuit 804 have combiner inputs 828 including, for example, combiner inputs 828a, 828b, 828c, and 828n coupled to, respectively, DLL outputs 818a, 818b, 818c, and 818n. Edge combiner circuit 804 has pulse signal outputs 732 including, for example, pulse signal outputs 732a, 732b, 732c, and 732n. Edge combiner circuit 804 can generate pulse signals 524 (e.g., 524a, 524b, 524c, and 524n) at pulse signal outputs 732 based on detecting edges (e.g., rising edges) of pairs of phase shifted clock signals 816. Edge combiner circuit 804 can set the pulse width of a pulse signal 524 based on the delay between the edges of pairs of phase shifted clock signals 816.

In some examples, pulse signal generator 730 may include a delay chain including multiple delay cells and edge combiner circuit 804, and the feedback loop of DLL 802 can be disabled or otherwise disconnected from the delay chain. For example, the feedback loop of DLL 802 can be enabled as part of a calibration operation to generate the bias/capacitive load setting to achieve the target total delay/phase shift of the delay chain, and the bias/capacitive load setting can then be stored (e.g., in a set of registers) and provided to the delay chain, with the feedback loop disabled.

Figure 9:
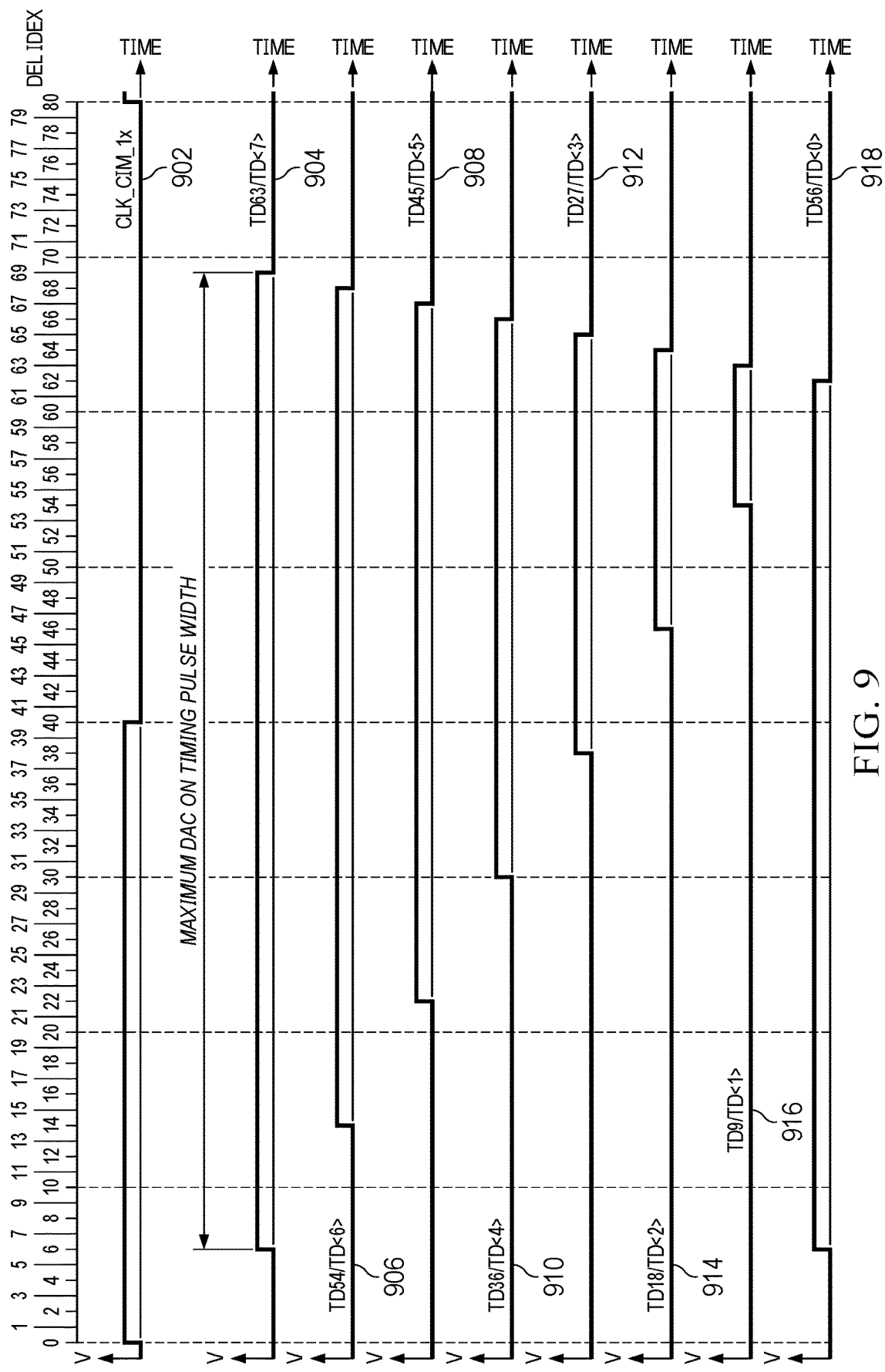
FIG. 9 includes graphs illustrating operations of the pulse signal generator of FIG. 7 in various examples.

FIG. 9 illustrates example operations of edge combiner circuit 804 in generating pulse signals 524b ($TD_9$), 524c ($TD_{18}$), 524d ($TD_{27}$), 524e ($TD_{36}$), 524f ($TD_{45}$), 524g ($TD_{54}$), and 524n ($TD_{63}$). In the example operations illustrated in FIG. 9, the delay chain of DLL 802 includes 80 delay cells, each configured to provide a delay/phase shift of the unit interval to. In FIG. 9, delay index can refer a particular delay cell in the delay chain, where a delay index of 0 (or 80) refers to the first delay cell in the delay chain, and a delay index of 79 refers to the last delay cell in the delay chain. FIG. 9 includes graphs 902, 904, 906, 908, 910, 912, 914, 916, and 918. Graph 902 represents the voltage variation of reference clock signal 814 with respect to time, which shows that reference clock signal 814 has a cycle period that spans the total delay provided by the 80 delay cells of DLL 802.

Also, graph 904 represents the voltage variation of pulse signal 524n ($TD_{63}$) with respect to time, graph 906 represents the voltage variation of pulse signal 524g ($TD_{54}$) with respect to time, graph 908 represents the voltage variation of pulse signal 524f ($TD_{45}$) with respect to time, graph 912 represents the voltage variation of pulse signal 524e ($TD_{36}$) with respect to time, graph 914 represents the voltage variation of pulse signal 524d ($TD_{27}$) with respect to time, graph 916 represents the voltage variation of pulse signal 524c ($TD_{18}$) with respect to time, graph 916 represents the voltage variation of pulse signal 524b ($TD_9$) with respect to time, and graph 918 represents the voltage variation of pulse signal 524n ($TD_{54}$) with respect to time.

Edge combiner circuit 804 can generate a rising edge and falling edge of a pulse signal based on detecting the rising edge/falling edge of different delay cells outputs, as illustrated in graphs 904-916 and Table 2 below:

TABLE 2

| Pulse signal | Rising edge trigger | Falling edge trigger |
| --- | --- | --- |
| $TD_9$ | Delay cell 53 output | Delay cell 62 output |
| $TD_{18}$ | Delay cell 45 output | Delay cell 63 output |
| $TD_{27}$ | Delay cell 37 output | Delay cell 64 output |
| $TD_{36}$ | Delay cell 29 output | Delay cell 65 output |
| $TD_{45}$ | Delay cell 21 output | Delay cell 66 output |
| $TD_{54}$ | Delay cell 13 output | Delay cell 67 output |
| $TD_{63}$ | Delay cell 5 output | Delay cell 68 output |
| $TD_{56}$ | Delay cell 5 output | Delay cell 61 output |

Figure 10:
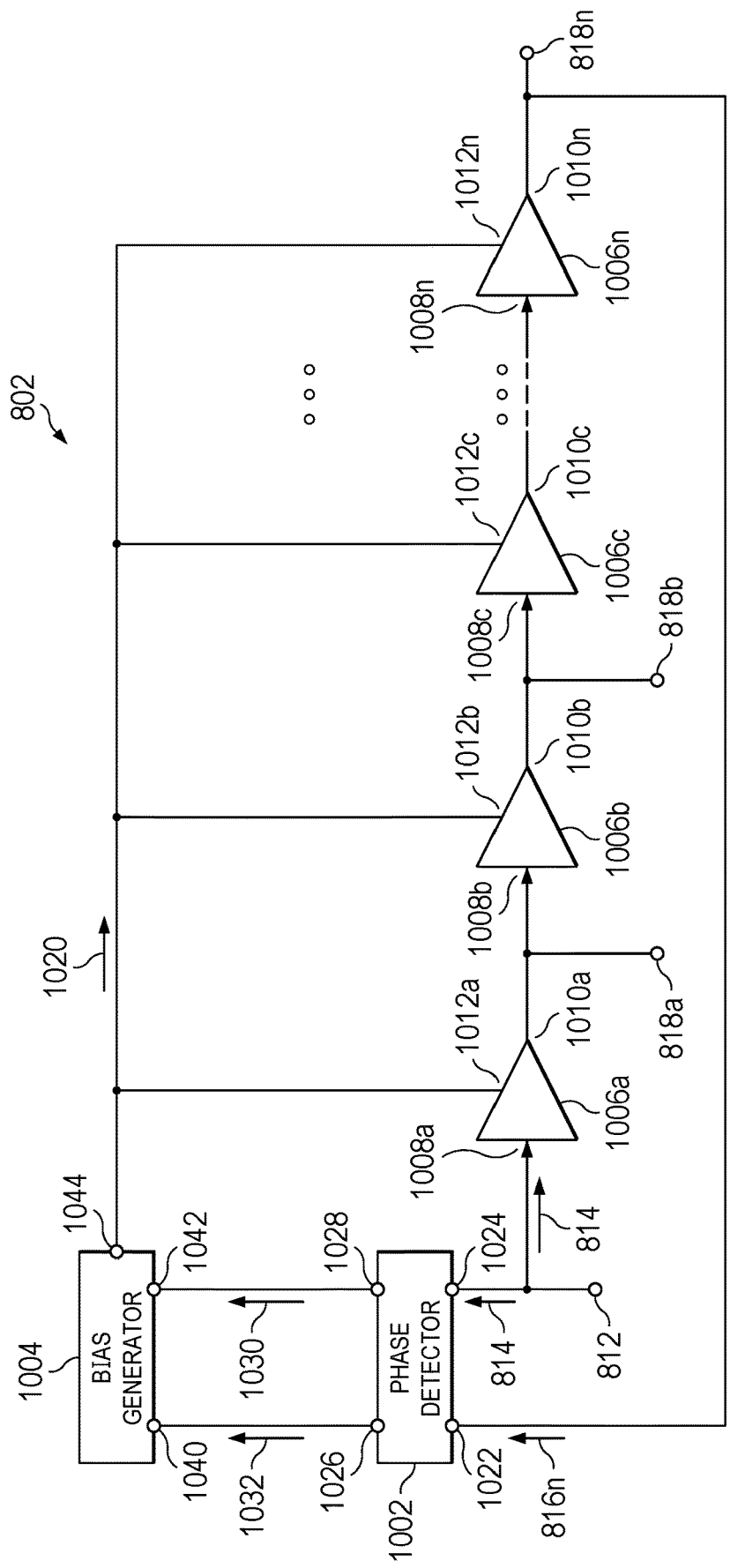
FIG. 10 and FIG. 11 are schematic diagrams illustrating a delay locked loop (DLL) of the pulse signal generator of FIG. 7 in various examples.

FIG. 10 illustrates examples of internal components of DLL 802. Referring to FIG. 10, DLL 802 has a phase detector 1002, a bias generator 1004, and a delay chain including delay cells 1006 such as delay cells 1006a, 1006b, 1006c, and 1006n. Each delay cell has a clock input 1008, a clock output 1010, and a bias input 1012. For example, delay cell 1006a has a clock input 1008a, a clock output 1010a, a bias input 1012a. Delay cell 1006b has a clock input 1008b, a clock output 1010b, and a bias input 1012b. Delay cell 1006c has a clock input 1008c, a clock output 1010c, and a bias input 1012c. Also, delay cell 1006n has a clock input 1008n, a clock output 1010n, and a bias input 1012n. In the example of FIG. 10, delay cell 1006a can be the first delay cell in the delay chain, with clock input 1008a coupled to reference clock input 812, and clock output 1010a coupled to DLL output 818a. Delay cell 1006b can be the second delay cell in the delay chain, with clock input 1008b coupled to clock output 1010a and clock output 1010b coupled to DLL output 818b. Delay cell 1006c can be the third delay cell in the delay chain, with clock input 1008c coupled to clock output 1010b and clock output 1010c coupled to DLL output 818c. Delay cell 1006n can be the last delay cell in the delay chain, with clock output 1010n coupled to DLL output 818n. Each delay cell 1006 also receives a control signal 1020 which sets the delay between the clock input and the clock output of the delay cell. In some examples, control signal 1020 can be a bias signal that sets the current provided by the delay cell in charging/discharging a capacitive load, and setting the current can adjust the delay provided by the delay cell.

DLL 802 includes phase detector (PD) 1002 and bias generator 1004 to generate control signal 1020. Phase detector 1002 has a first PD input 1022, a second PD input 1024, an up output 1026 and a down output 1028. First PD input 1022 is coupled to DLL output 818n to receive clock signal 816n, and second PD input 1024 is coupled to reference clock input 812 to receive reference clock signal 814. PD 1002 can detect whether reference clock signal 814 leads or lags clock signal 816n. If reference clock signal 814 leads clock signal 816n, which indicates that the total delay provided the delay chain exceeds a cycle period of reference clock signal 814, PD 1002 can provide an asserted down signal 1030 at down output 1028 to decrease the delay of the delay chain. Also, if reference clock signal 814 lags clock signal 816n, which indicates that the total delay provided the delay chain is less than the cycle period of reference clock signal 814, PD 1002 can provide an asserted up signal 1032 at up output 1026 to increase the delay of the delay chain.

Also, bias generator 1004 has an up input 1040, a down input 1042, and a bias output 1044. Up input 1040 is coupled to up output 1026, and down input 1042 is coupled to down output 1028, and bias output 1044 is coupled to bias inputs 1012 of delay cells 1006. Responsive to an asserted up signal at up input 1040, bias generator 1004 can adjust control signal 1020 at bias output 1044 to increase the delay of each delay cell. Responsive to an asserted down signal at down input 1042, bias generator 1004 can adjust control signal 1020 at bias output 1044 to decrease the delay of each delay cell. In some examples, bias generator 1004 can include a charge and discharge circuit coupled to a capacitor forming a charge pump. The charge and discharge circuit can charge or discharge the capacitor based on the state of the up input 1040 and down input 1042 to set control signal 1020.

Figure 11:
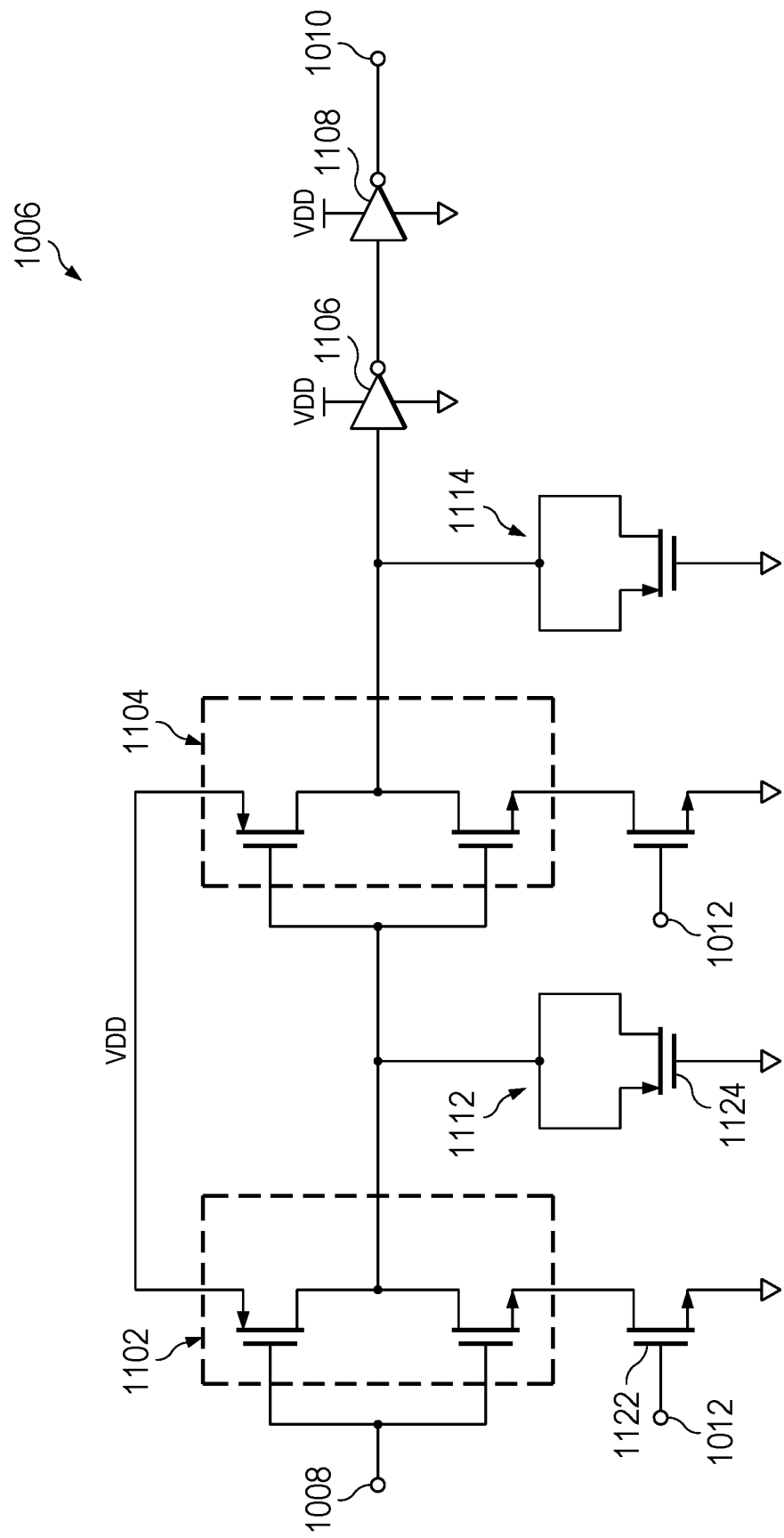

FIG. 11 illustrates examples of internal components of delay cell 1006. Referring to FIG. 11, delay cell 1006 can include a first inverter 1102, a second inverter 1104, a third inverter 1106, and a fourth inverter 1108 coupled in series between clock input 1008 and clock output 1010. Delay cell 1006 also includes a capacitor 1112 coupled at the output of first inverter 1102 and a capacitor 1114 coupled at the output of second inverter 1104. In the example illustrated in FIG. 11, delay cell 1006 also includes a current source 1122 coupled between the pull down portion of first inverter 1102 and the ground terminal, and a current source 1124 coupled between the pull down portion of second inverter 1104 and the ground terminal. The control terminals of current sources 1122 and 1124 are coupled to bias input 1012. In other examples, current sources 1122 and 1124 can be coupled between a power terminal (e.g., VDD) and the respective pull up portions of first inverter 1102 and second inverter 1104.

Delay cell 1006 of FIG. 11 can provide balanced rising edge and falling edge delays across PVTs, which can reduce the variations in the pulse widths of pulse signals 524 across PVTs. Specifically, for a rising edge at clock input 1008, the pull down portion of first inverter 1102 is enabled, and first inverter 1102 can provide a controlled delay set by the bias signal at bias input 1012, and the controlled delay dominates the delay between clock input 1008 and clock output 1010. Also, for a falling edge at clock input 1008, the pull down portion of second inverter 1104 is enabled, and second inverter 1104 can provide a controlled delay that dominates the delay between clock input 1008 and clock output 1010. The controlled delays provided by first inverter 1102 and second inverter 1104 can be equal across PVTs, so that delay cell 1006 can provide balanced rising edge and falling edge delays across PVTs.

Figure 12:
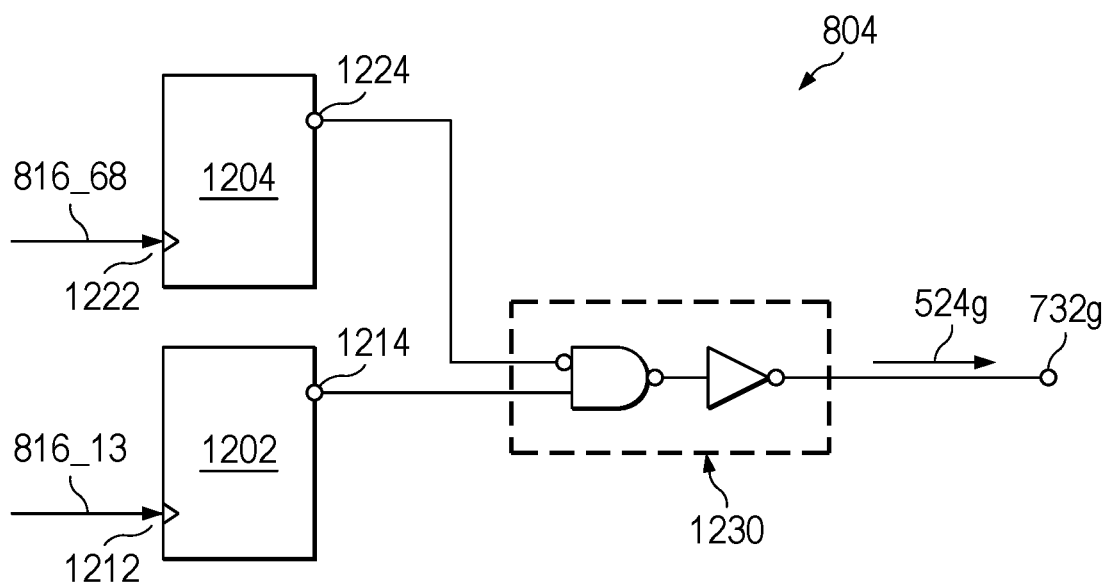
FIG. 12 is a schematic diagram illustrating an edge combiner circuit of the pulse signal generator of FIG. 7 in various examples.

FIG. 12 illustrate examples of internal components of edge combiner circuit 804. In FIG. 12, only part of edge combiner circuit 804 that generates a particular pulse signal, such as pulse signal 524$g$ (TD$_{54}$). In the example of FIG. 12, edge combiner circuit 804 includes sequential logic circuits 1202 and 1204, which can include flip-flops. Sequential logic circuit 1202 has a clock terminal 1212 and an output 1214. Clock terminal 1212 is coupled to one of DLL outputs 818$a$-$n$ to receive the clock signal 816 from delay cell 1006 of delay index 13 (labelled 816_13 in FIG. 12). Also, sequential logic circuit 1204 has a clock terminal 1222 and an output 1224. Clock terminal 1222 is coupled to another one of DLL outputs 818$a$-$n$ to receive the clock signal 816 from delay cell 1006 of delay index 68 (labelled 816_68 in FIG. 12). Both sequential logic circuits 1202 and 1204 also have reset inputs (not shown), and can be reset at the beginning of a cycle period of reference clock signal 814. Sequential logic circuit 1202 can set output 1214 to logical zero after being reset, and set output 1214 to logical one responsive a rising edge of clock signal 816_13. Also, sequential logic circuit 1204 can set output 1224 to logical zero after being reset, and set output 1224 to logical one responsive a rising edge of clock signal 816_68.

Edge combiner circuit 804 also includes processing circuit 1230 having inputs coupled to outputs 1214 and 1224, and pulse signal output 732$g$ to provide pulse signal 524$g$. Processing circuit 1230 can include various logic gates, such as AND gate, inverter, etc. Processing circuit 1230 can set pulse signal 524$g$ to the logical zero state if both outputs 1214 and 1224 are in the logical zero state after sequential logic circuits 1202 and 1204 are reset at the beginning of a cycle of reference clock signal 814. Processing circuit 1230 can also set pulse signal 524$g$ to the logical one state if output 1214 transitions to the logical one state (responsive to rising edge of clock signal 816_13) and output 1224 remains in the logical zero state. Processing circuit 1230 can also set pulse signal 524$g$ back to the logical zero state if output 1224 transitions to the logical one state (responsive to clock signal 816_68), thereby setting the pulse width of pulse signal 524$g$. Both sequential logic circuits 1202 and 1204 are then reset at the beginning of next cycle of reference clock signal 814.

As described above, the amount of current provided by current source 502 of DAC 500, $I_{DAC}$, may vary across PVTs. The variations of $I_{DAC}$ can lead to variations in the step size and gain of DAC 500 across PVTs. In some examples, DLL 802 can be calibrated to compensate for the variations of $I_{DAC}$, instead of or (or in addition to) calibration of $I_{DAC}$ provided by current source 502. With such arrangements, additional segmented current sources can be omitted, or at least reduced, to support the calibration operation, which can reduce the hardware and power consumption involved in the calibration operation.

Figure 13A:
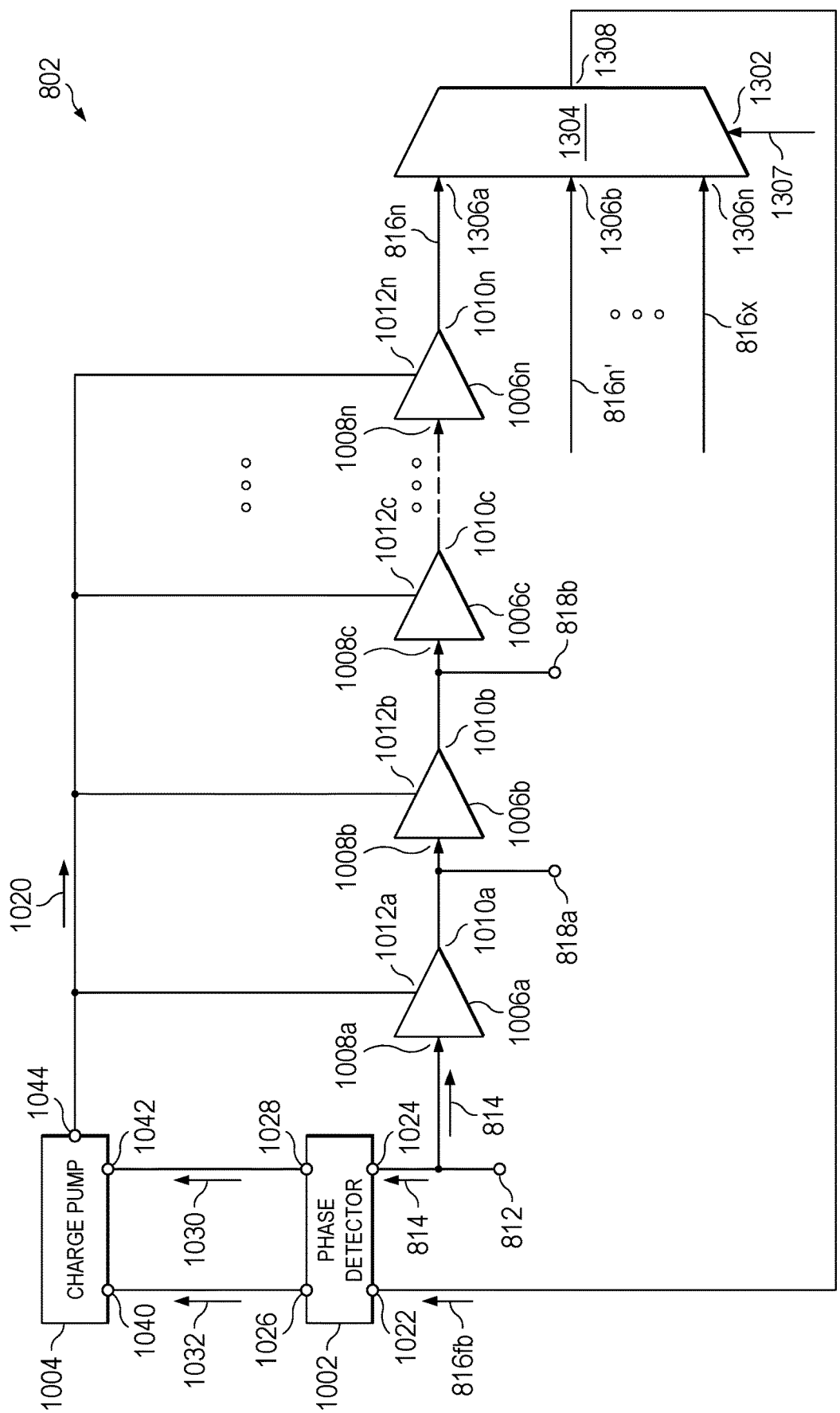
FIG. 13A, FIG. 13B, FIG. 13C, and FIG. 13D are schematic diagrams illustrating a calibration circuit and internal components of a DLL to support a calibration operation in various examples.

FIG. 13A, FIG. 13B, FIG. 13C, and FIG. 13D illustrate example components of system 700 to support the calibration operation. Referring to FIGS. 13A, DLL 802 can have a control terminal 1302 and a multiplexor 1304. Multiplexor 1304 have inputs 1306 (e.g., 1306$a$, 1306$b$, 1306$n$) to receive multiple phase shifted clock signals from different delay cells 1006 along the delay chain, such as clock signals 816$n$ (from delay cell 1006$n$), 816$n'$, 816$x$, etc., Multiplexor 1304 can select one of the clock signals as feedback clock signal 816$fb$ based on a selection signal 1307 at control terminal 1302, and provide feedback clock signal 816$fb$ to phase detector 1002 via output 1308. Phase detector 1002 and bias generator 1004 adjust the control/bias signal 1020 to delay cells 1006 so that feedback clock signal 816$fb$ is phase shifted from reference clock signal 814 by one cycle period of reference clock signal 814. Accordingly, based on selection signal 1307, multiplexor 1304 can select a number of delay cells included in the delay chain to generate a delay equal to a cycle period of reference clock signal 814 (cycle period delay), which sets the unit interval to, the pulse widths of pulse signals 524$a$-524$n$ (which are multiples of $t_0$) and the duration $T_{ON}$ (in which capacitor 510 is charged by the $I_{DAC}$ current from current source 502).

Figure 13B:
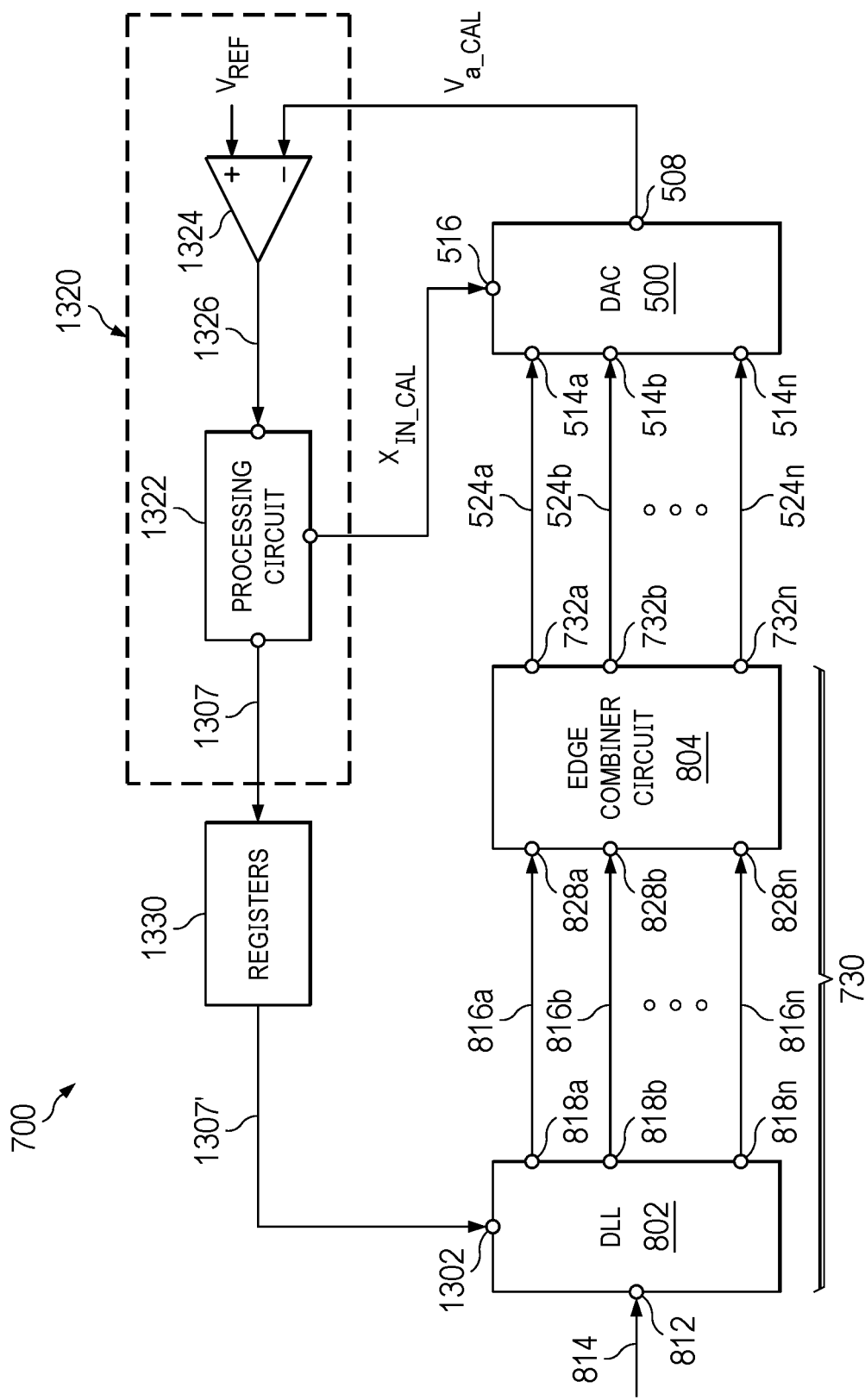

Also, referring to FIG. 13B, system 700 can include a calibration circuit 1320 to perform the calibration. Calibration circuit 1320 can include a processing circuit 1322 that provides digital signals $X_{IN\_CAL}$ representing a maximum value to be converted by DAC 500 to an analog voltage $V_{a\_CAL}$. Calibration circuit 1320 can include a comparator 1324. Comparator 1324 can compare the analog voltage $V_{a\_CAL}$ with a reference voltage VREF and generate a comparison signal 1326. If comparison signal 1326 indicates that $V_{a\_CAL}$ is lower that VREF, which may indicate that the current source $I_{DAC}$ is lower than a target value and is therefore insufficient to charge capacitor 510 to VREF within the $T_{ON}$ duration, processing circuit 1322 can generate selection signal 1307 to reduce the number of delay cells 1006 included in the generation of the cycle period delay, to increase the unit interval to and the duration $T_{ON}$. Also, if comparison signal 1326 indicates that $V_{a\_CAL}$ is higher that VREF, which may indicate that the current source $I_{DAC}$ is larger than a target value and therefore overcharges capacitor 510, processing circuit 1322 can generate selection signal 1307 to increase the number of delay cells 1006 included in the generation of the cycle period delay, to decrease the unit interval to and the duration $T_{ON}$. Processing circuit 1322 can perform the calibration operation by providing selection signals 1307 to select different number of delay cells, and stop the calibration operation when a convergence is reached (e.g., based on detecting that the state of comparison signal 1326 toggles for a threshold number of times). With the calibration operation, calibration circuit 1320 can reduce the variation of gain and step size of the digital to analog conversion provided by DAC 500 due to variations of $I_{DAC}$ across PVTs.

In some examples, after convergence is reached, processing circuit 1322 may store selection signals 1307 at registers 1330 and disable calibration circuit 1320, and DLL 802 can receive selection signals 1307' from registers 1330 from prior calibration operation.

Figure 13C:
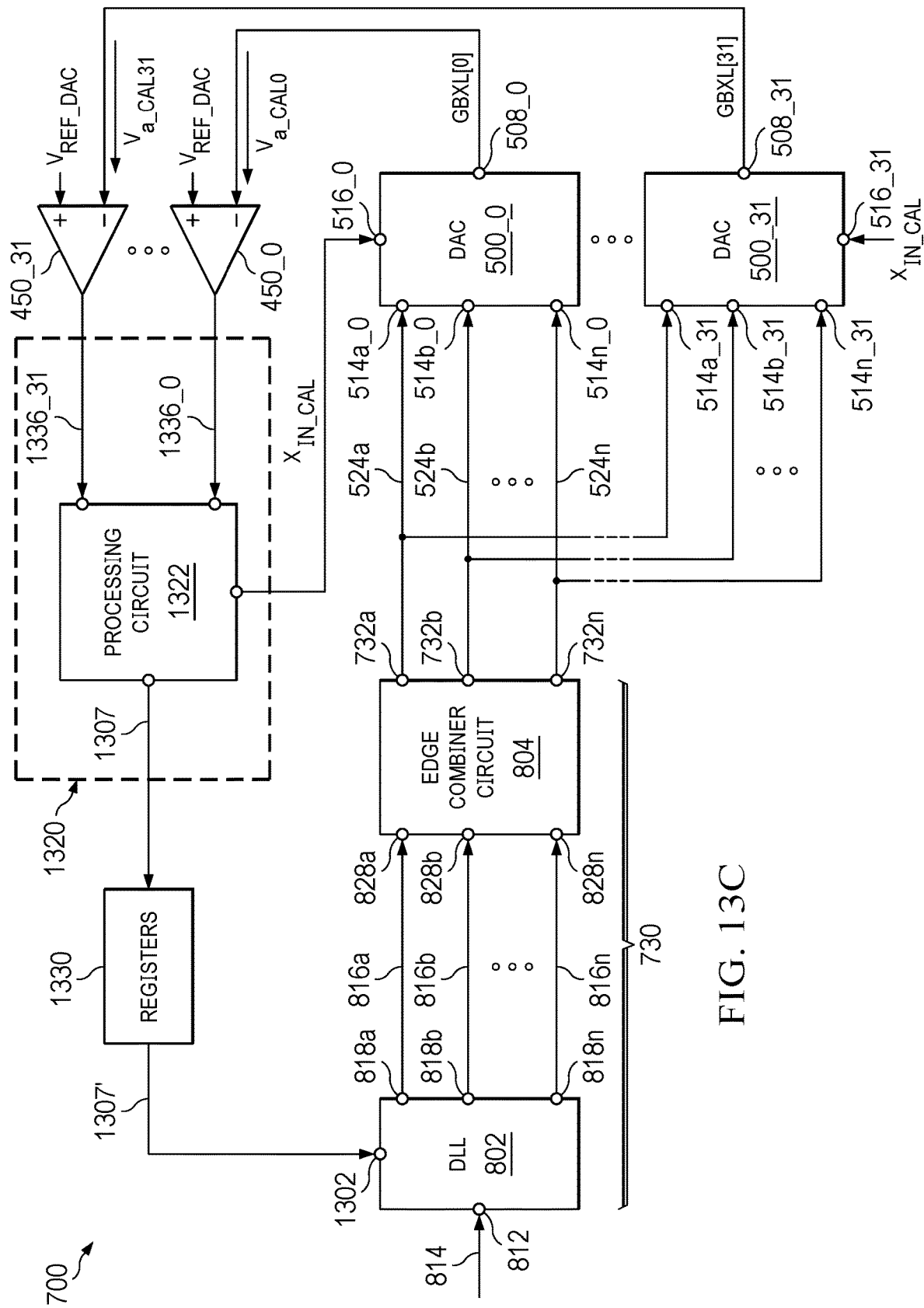

FIG. 13C illustrates another example of system 700. In the example of FIG. 13C, CIM array 204 can operate in the memory mode, and processing circuit 1322 of calibration circuit 1320 can be coupled to sense amplifiers 450 including sense amplifiers 450_0 and 450_31. As described above, each sense amplifier is coupled to a respective GBXL interconnect, such as sense amplifier 450_0 coupled to GBXL[0] and sense amplifier 450_31 coupled to GBXL [31]. Each GBXL interconnect is coupled to (and driven by) a respective DAC. For example, DAC 500_0 is coupled to GBXL[0] and DAC 500_31 is coupled to GBXL [31].

Processing circuit 1322 can provide digital signals $X_{IN\_CAL}$ to each of DACs 500, and each DAC 500 generates a respective analog voltage $V_{a\_CAL}$. For example, DAC 500_0 generates $V_{a\_CAL0}$, and DAC 500_31 generates $V_{a\_CAL31}$. Sense amplifier 450_0 can generate a comparison signal 1326_0 representing a comparison between voltage $V_{a\_CAL0}$ and a DAC reference voltage VREF DAC. $V_{REF\_DAC}$ can represent a target voltage to be generated by DAC 500 from $X_{IN\_CAL}$, and sense amplifier 450_31 can generate a comparison signal 1336_31 representing a comparison between $V_{a\_CAL31}$ and $V_{REF\_DAC}$. In some examples, $X_{IN\_CAL}$ can be a maximum digital value (e.g., 63) to be converted by DAC 500, and VREF DAC can represent a target maximum voltage to be provided by DAC 500 responsive to the maximum digital value. Processing circuit 1322 can determine, based on comparison signals 1336_0-1336_31, a first number of DACs 500 that generate the analog voltage $V_{a\_CAL}$ exceeding $V_{REF\_DAC}$, and a second number of DACs 500 that generate the analog voltage $V_{a\_CAL}$ below $V_{REF\_DAC}$. Processing circuit 1322 perform the calibration operation by providing $X_{IN\_CAL}$ and adjusting selection signals 1307 to select different number of delay cells, which also sets $T_{ON}$, based on the first and second numbers. For example, processing circuit 1322 can stop the calibration operation when the first number equals the second number, which can indicate that half of the sense amplifiers detect that GXBL has reached higher than or equal to DAC reference voltage. Such arrangements can calibrate DACs 500 to operate at the mid-point of the variations among DACs 500.

Figure 13D:
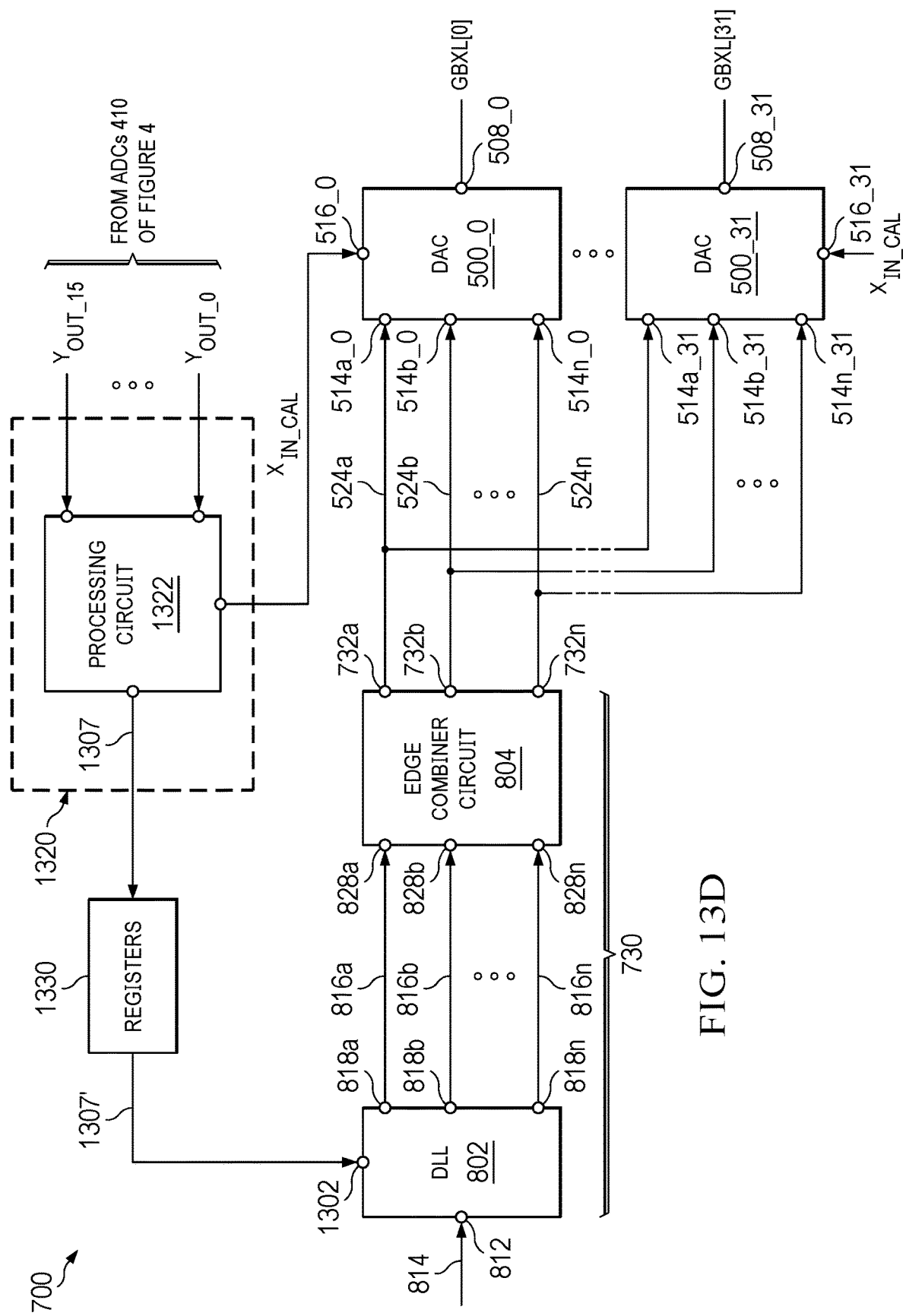

FIG. 13D illustrates another example of system 700. In the example of FIG. 13D, processing circuit 1322 can receive digital outputs $Y_{OUT}$ from ADCs 410, such as digital output $Y_{OUT\_0}$ from ADC 410_0 and $Y_{OUT\_15}$ from ADC 410_15. CIM array 204 can store a set of weights all of which representing +1 or −1. To perform the calibration operation, processing circuit 1322 can provide $X_{IN\_CAL}$ as a digital ramp from 0 to a maximum digital value (e.g., 63) sequentially to each of DACs 500, which convert the $X_{IN\_CAL}$ to analog voltages and provide the analog voltages to CIM array 204. CIM array 204 can perform the aforementioned MAV operations between the stored weights and $X_{IN\_CAL}$ and generate voltages representing the result of the MAV operations, and the voltages can be converted by ADCs 410 into digital outputs $Y_{OUT\_0}$ to $Y_{OUT\_15}$. Processing circuit 1322 can store the digital outputs $Y_{OUT\_0}$ to $Y_{OUT\_15}$ for each digital value of $X_{IN}$ CAL. Processing circuit 1322 can also determine the slope of each of $Y_{OUT\_0}$ to $Y_{OUT\_15}$ with respect to the different digital values of $X_{IN\_CAL}$, and adjust $T_{ON}$ by adjusting selection signals 1307, until the slopes reach target slope values for each of $Y_{OUT\_0}$ to $Y_{OUT\_15}$. The slopes can represent a transfer function of the MAV operations on $X_{IN\_CAL}$ with weights at +1 or −1.

Figure 14:
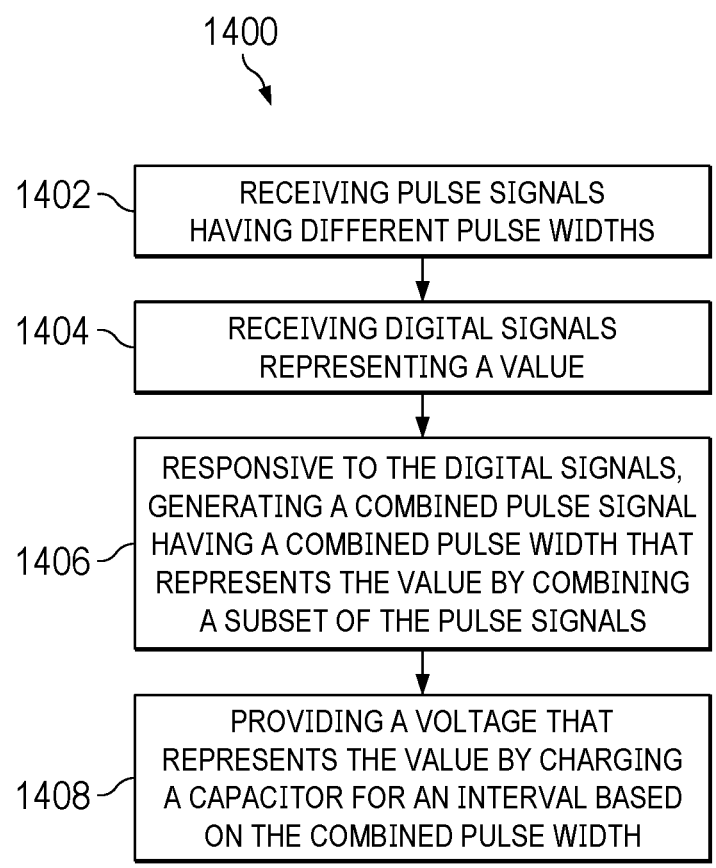
FIG. 14 is a flow diagram of a method of digital to analog conversion in various examples.

FIG. 14 illustrates a flowchart of an example method 1400 of performing digital to analog conversion. Method 1400 can be performed by, for example, DAC 500 in conjunction with pulse signal generator 730 which can include DLL 802 and edge combiner circuit 804.

In operation 1402, DAC 500 receives pulse signals having different pulse widths. One of the pulse signals (e.g., $TD_0$) may have zero pulse width. As described below, the pulse signals can be provided by DLL 802 and edge combiner circuit 804, and the rising edges and falling edges of the pulse signals are separated by multiples of unit intervals, where each unit interval can be a phase shift/delay provided by a delay cell 1006 of DLL 802. The unit interval can also correspond to a step size and gain of the digital to analog conversion provided by DAC 500. As described above, DLL 802 can be calibrated (e.g., by selecting a number of delay cells to provide the cycle period delay) to reduce the variation of gain and step size of the digital to analog conversion provided by DAC 500 across PVTs.

In operation 1404, DAC 500 receives digital signals (e.g., $X_{IN}$) representing a value. The digital signals can be input data to be combined with the weights stored in CIM 204. The digital signals represent multiple bits.

In operation 1406, responsive to the digital signals, DAC 500 generates a combined pulse signal having a combined pulse width that represents the value by combining a subset of the pulse signals. As described above, the combined pulse signal (e.g., control signal 528) can be generated by multiplexor circuit 520. Multiplexor circuit 520 can select a first one of the pulse signals based on the MSBs of the digital signals in a first conversion phase, and select a second one of the pulse signals based on the LSBs of the digital signals in a second conversion phase. The same or different pulse signals can be selected in the first and second conversion phases. The first and second conversion phases can be continuous in time (or overlap in time) so that the pulse signals selected in the two different conversion phases merge into one continuous pulse signal, which can reduce the switching and improve linearity of the digital to analog conversion operation.

In operation 1408, DAC 500 can provide a voltage (analog voltage $V_a$) that represents the value by charging a capacitor for an interval ($T_{ON}$) based on the combined pulse width. During the $T_{ON}$ interval, switch 506 is enabled, and current source 502 can charge capacitor 510 with the current $I_{DAC}$. As the duration of the $T_{ON}$ interval represents the value, the voltage at capacitor 510 as a result of the charging can also represent the value.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

While particular transistor structures are referred to above, other transistors or device structures may be used instead. For example, p-type MOSFETs may be used in place of n-type MOSFETs with little or no additional changes. In addition, other types of transistors (such as bipolar transistors) may be utilized in place of the transistors shown. The capacitors may be implemented using different device structures (such as metal structures formed over each other to form a parallel plate capacitor) or may be formed on layers (metal or doped semiconductors) closer to or farther from the semiconductor substrate surface.

As used above, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

While certain components may be described herein as being of a particular process technology, these components may be exchanged for components of other process technologies. Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor. Also, uses of the phrase "ground terminal" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means +/−10 percent of the stated value.

Modifications are possible in the described examples, and other examples are possible, within the scope of the claims.

What is claimed is:

1. A circuit comprising:
   a current source having a current output;
   a switch coupled between the current output and a current terminal, the switch having a switch control input;
   a signal generator circuit having outputs and including delay circuits, the signal generator circuit configurable to provide signals having different pulse widths at the outputs using the delay circuits; and
   a multiplexor circuit having inputs, a selection input and an output, the output of the multiplexor circuit coupled to the switch control input, and the inputs of the multiplexor circuit coupled to the outputs of the signal generator circuit.

2. The circuit of claim 1, wherein the signals are first signals, and the multiplexor circuit is configurable to:
   receive second signals at the selection input representing a value; and
   responsive to the second signals at the selection input and a subset of the first signals, provide a third signal at the output, the third signal having a pulse width that represents the value.

3. The circuit of claim 2, wherein at least one of the first signals has a zero pulse width.

4. The circuit of claim 2, wherein the first signals have a cycle period, and pairs of the first signals have rising edges separated by a first interval and falling edges separated by a second interval in the cycle period.

5. The circuit of claim 4, wherein the multiplexor circuit is configurable to:
   select a first one of the first signals responsive to a first selection signal at the selection input;
   select a second one of the first signals responsive to a second selection signal at the selection input; and
   provide the third signal as a combination of the first and second ones of the first signals at the output,
   wherein the first selection signal represents most significant bits (MSBs) portion of the second signals, the second selection signal represents least significant bits (LSBs) portion of the second signals, and a total pulse width of the first and second ones of the first signals reflects the value.

6. The circuit of claim 5, wherein the first interval represents a difference between two consecutive numbers representing the MSB portions of the second signals, and the second interval represents a difference between two consecutive numbers representing the LSB portions of the second signals.

7. The circuit of claim 5, wherein the selection input is a first selection input, the circuit further comprising a subcircuit coupled to the first selection input, the subcircuit having a second selection input and configurable to:
  receive a third selection signal at the second selection input;
  provide the first selection signal at the first selection input responsive to the third selection signal within a first phase of the cycle period; and
  determine the second selection signal from the third selection signal within a second phase of the switching cycle; and
  wherein the first signals have the rising edges within the first phase and the falling edges within the second phase.

8. The circuit of claim 7, wherein the subcircuit has a phase input coupled to one of the outputs of the signal generator circuit, and the subcircuit is configurable to detect the first phase and the second phase responsive to a state of the phase input.

9. The circuit of claim 1, further comprising a capacitor coupled between the current terminal and a ground terminal.

10. The circuit of claim 1, wherein signal generator includes a delay locked loop (DLL) including the delay circuits, the DLL has a DLL input, a DLL output, and a bias terminal, the delay circuits coupled between the DLL input and the DLL output, each delay circuit having a respective input, a respective output, and the bias terminal, and the DLL including:
  a bias generator having a control input and a bias output, the bias output coupled to the bias terminal; and
  a phase detector having first and second detector inputs and a detector output, the first detector input coupled to the DLL input, the second detector input coupled to the DLL output, and the detector output coupled to the control input.

11. The circuit of claim 10, wherein the signal generator circuit includes edge combiners coupled between outputs of the delay circuits and the outputs of the signal generator, each edge combiner configurable to generate a respective one of the signals responsive to a rising edge at the output of one of the delay circuits and detecting a falling edge at the output of a different one of the delay circuits.

12. The circuit of claim 10, wherein the multiplexor circuit is a first multiplexor circuit, the selection input is a first selection input, the DLL include a second multiplexor circuit coupled between the outputs of the delay circuits and the DLL output, the second multiplexor circuit having a second selection input and configurable to connect a subset of the delay circuits between the DLL input and the DLL output responsive to a state of the second selection input.

13. The circuit of claim 12, further comprising registers coupled to the second selection input.

14. The circuit of claim 12, further comprising a calibration circuit having a calibration input, a reference input, and a calibration output, the calibration input coupled to the current terminal, and the calibration output coupled to the second selection input, the calibration circuit configurable to set the state of the second selection input responsive to a comparison between a first voltage at the current terminal and a reference voltage at the reference input.

15. The circuit of claim 14, wherein the current source, the switch, and the multiplexor circuit are part of a digital to analog converter (DAC), the DAC having an analog output coupled to the current terminal;
  wherein the circuit further comprises DACs each including the current source, the switch, and the multiplexor circuit; and wherein the circuit further comprises a calibration circuit having multiple calibration inputs, a reference input, and a calibration output, each of the calibration inputs coupled to a respective analog output of each of the DACs, the calibration circuit has a calibration output coupled to the second selection input, the calibration circuit configurable to:
  compare each of first voltages at the calibration inputs with the reference voltage to generate comparison results; and
  set the state of the second selection input responsive to the comparison results.

16. The circuit of claim 12, wherein the current source, the switch, and the multiplexor circuit are part of a digital to analog converter (DAC), the DAC having an output coupled to the current terminal;
  wherein the circuit further comprises DACs each including the respective current source, the respective switch, and the respective multiplexor circuit, each DAC including a digital input coupled to the respective selection input of the respective multiplexor circuit; and
  wherein the circuit further comprises a calibration circuit having calibration inputs, a DAC code output, and a calibration output, the DAC code output coupled to the inputs of the DACs, the calibration output coupled to the second selection input, and the calibration circuit configurable to:
    provide fourth signals at the DAC code output sequentially;
    receive fifth signals at the calibration inputs;
    determine a relationship between the fourth and fifth signals; and
    set the state of the second selection input responsive to determining the relationship.

17. The circuit of claim 16, further comprising:
  a compute-in-memory (CIM) array having compute inputs and compute outputs, the compute inputs coupled to the outputs of the DACs; and
  analog-to-digital converters (ADC) each having an input and an, the inputs of the ADCs coupled to the compute outputs,
  wherein the calibration inputs of the calibration circuit are coupled to the outputs of the ADCs.

18. A system including:
  a compute-in-memory (CIM) array having compute inputs and compute outputs;
  digital-to-analog converters (DAC) each having first inputs, a second input, and an analog output, the analog outputs of the DACs coupled to the compute inputs, each DAC including:
    a current source coupled to a current output;
    a switch coupled between the current output and the analog output, the switch having a switch control input;
    a multiplexor circuit having inputs coupled to the first inputs, a selection input coupled to the second input, and an output coupled to the switch control input; and
    a pulse signal generator having outputs coupled to the first inputs, the pulse signal generator including delay circuits and configurable to provide signals having different pulse widths at the outputs using the delay circuits; and
  analog-to-digital converters (ADC) each having an analog input and a digital output, the analog inputs of the ADCs coupled to the compute outputs.

19. The system of claim 18, wherein the signals are first signals, and the multiplexor circuit is configurable to:
   receive second signals at the selection input representing a value; and
   responsive to the second signals and a subset of the first signals, provide a third signal at the output, the third signal having a pulse width that represents the value.

20. The system of claim 19, wherein at least one of the first signals has a zero pulse width.

21. The system of claim 18, wherein the signals have a cycle period, and pairs of the signals have rising edges separated by a first interval and falling edges separated by a second interval in the cycle period.

22. A method comprising:
   generating, using a delay circuits, first signals having different pulse widths;
   receiving second signals representing a value;
   responsive to the second signals, combining a subset of the first signals to generate a third signal having a pulse width that represents the value; and
   charging a capacitor for an interval based on the pulse width to provide a voltage that represents the value.

23. The method of claim 22, wherein at least one of the first signals has a zero pulse width.

* * * * *